(12) United States Patent
Ryu et al.

(10) Patent No.: US 10,069,073 B2
(45) Date of Patent: Sep. 4, 2018

(54) ORGANIC COMPOUNDS AND ORGANIC LIGHT EMITTING DEVICE COMPRISING THE SAME

(71) Applicant: LG DISPLAY CO., LTD., Seoul (KR)

(72) Inventors: Youngju Ryu, Paju-si (KR); Seungjae Lee, Paju-si (KR); Jongkwan Bin, Paju-si (KR); Joonghwan Yang, Gwangmyeong-si (KR); Bangsook Lee, Seoul (KR); Bomin Seo, Paju-si (KR); Inae Shin, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 93 days.

(21) Appl. No.: 14/553,601

(22) Filed: Nov. 25, 2014

(65) Prior Publication Data

US 2015/0155490 A1    Jun. 4, 2015

(30) Foreign Application Priority Data

Dec. 3, 2013 (KR) .................. 10-2013-0149385

(51) Int. Cl.
*H01L 51/00* (2006.01)
*H01L 51/50* (2006.01)

(52) U.S. Cl.
CPC ........ *H01L 51/005* (2013.01); *H01L 51/0051* (2013.01); *H01L 51/5088* (2013.01)

(58) Field of Classification Search
None
See application file for complete search history.

(56) References Cited

U.S. PATENT DOCUMENTS

2012/0193619 A1    8/2012    Taka et al.

FOREIGN PATENT DOCUMENTS

| CN | 101410364 A | 4/2009 |
|----|-------------|--------|
| JP | 63-203656 A | 8/1988 |
| JP | 2010-44882 A | 2/2010 |
| JP | 2011-86442 A | 4/2011 |

OTHER PUBLICATIONS

Asakawa et al., J. Phys. Chem., 8, 2012, 116, pp. 4016-4023.*
STN Registry Database entry for CAS RN 1071142-96-5, Entry date Nov. 6, 2008; Accessed Oct. 2, 2016.*
STN Registry Database entry for CAS RN 1332075-10-1, Entry date Sep. 13, 2011; Accessed Apr. 5, 2017.*
STN database entry for CAS RN 851-40-1. Entered STN Nov. 16, 1984. Accessed Aug. 8, 2017.*
Aumuller, et al. "N,N—Dicy noquinonediimines—A New Class of Compounds, II: Comparison of Redox Properties with those of Quinones and Tetracyanoquinodimethanes", Leibigs Ann. Chem 1986, p. 165-176.
Cosimbescu et al., "7,7,8,8-Tetracyanoquinodimethane-Based Molecular Dopants for p-Type Doping of OLEOs: A Theoretical Investigation", J. Phys. Chem. A 2011, vol. 115, p. 13498-13503.
Registry, RN: 1284234-08-7 (STN search data-annex 1), Apr. 22, 2011.
Registry, RN: 60421-85-4 (STN search data-annex 2), Nov. 16, 1584.

* cited by examiner

*Primary Examiner* — Alicia L Otton
(74) *Attorney, Agent, or Firm* — Birch, Stewart, Kolasch & Birch, LLP

(57) ABSTRACT

Provided are organic compounds capable of improving the efficiency of light emission and lowering the driving voltage of an organic light emitting device, and an organic light emitting device including the same. The organic compounds include an organic compound of chemical formula 1:

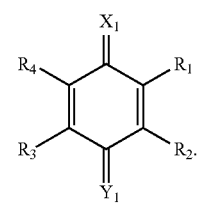

38 Claims, 6 Drawing Sheets

ORGANIC COMPOUNDS AND ORGANIC LIGHT EMITTING DEVICE COMPRISING THE SAME

This application claims priority and the benefit under 35 U.S.C. § 119(a) of Korean Patent Application No. 10-2013-0149385 filed on Dec. 3, 2013, which is hereby incorporated by reference for all purposes as if fully set forth herein.

BACKGROUND

Field of the Invention

The present invention relates to an organic compound and an organic light emitting device including the same, and more particularly, to an organic compound capable of improving the efficiency of light emission and lowering the driving voltage of an organic light emitting device, and to an organic light emitting device including the same.

Description of the Related Art

An image display device that implements a variety of information on a screen pertains to a core technology at the information and communication age, and is progressing in the direction of being thinner, lighter, easy to carry, and high functional. In recent years, with the development of the information society and the increase in various types of demands for display devices, studies on flat panel display devices, such as liquid crystal display (LCD), plasma display panel (PDP), electro luminescent display (ELD), field emission display (FED), and organic light emitting diode (OLED) are being actively conducted.

Of these, the organic light emitting diode is a device that, when charges are injected into an organic light emitting layer disposed between an anode and a cathode, electrons and holes make pairs, and then the pairs are extinguished to emit light. The organic light emitting device can be manufactured on a flexible transparent substrate such as plastic, driven at a lower driving voltage than a plasma display panel or an inorganic electroluminescent (EL) display, consume less power, and have excellent colors. In particular, an organic light emitting device implementing a white color is used for several purposes, such as an illumination, a thin type light source, a backlight of a liquid display device, or a full color display device employing a full color filter.

In the development of the white organic light emitting device, high efficiency, long lifetime, color purity, color stability with current and voltage changes, easy manufacturing of devices, and the like are important, and thus research and development according to each type are being conducted. There are several types in the structure of the white organic light emitting device, which can be largely classified into a single-layer light emission structure and a multi-layer light emission structure. Of these, a multi-layer light emission structure in which a fluorescent blue light emitting layer and a phosphorescent yellow light emitting layer are stacked (tandem) is mainly being adopted for a long-lifetime white color display device.

Specifically, a phosphorus stack structure in which a first stack using a blue fluorescent device as a light emitting layer and a second stack using a yellow-green phosphorus device as a light emitting layer are stacked is being used. This white organic light emitting device displays a white light by a mixture effect of a blue light emitted from a blue fluorescent device and a yellow light emitted from a yellow phosphorescent device. In this instance, a charge generation layer which doubles the efficiency of current generated from a light emitting layer and facilitates the distribution of charges is provided between a first stack and a second stack. The charge generation layer, which generates charges including electrons and holes, doubles the efficiency of current generated from the light emitting layer and facilitates the distribution charges, thereby preventing the driving voltage from being raised.

In addition, aromatic diamine derivatives have been well known as a hole transport material provided in the organic light emitting device. In the organic light emitting devices using the aromatic diamine derivatives as a hole transport material, the applied voltage is increased to obtain a sufficient light emission brightness, causing a decrease in the device lifetime and an increase in power consumption. For solving these problems, proposed is a method of doping a hole injection layer with an electron-acceptor compound, such as Lewis acid, or forming a separate layer. However, the electron-acceptor compound used therein is unstable in the handling in the manufacturing procedure of the organic light emitting device or is deficient in stability of, such as heat resistance, at the time of driving, and causes a decrease in the lifetime. In addition, F4TCNQ (tetrafluoro tetracyanoquinodimethane), which is a representative electron-acceptor compound, has a small molecular weight and contains a fluorine substituent, and thus has high sublimation property and is diffused in the apparatus at the time of vacuum deposition, causing fears that pollutes the apparatus or device. HAT-CN, which is another representative compound, has problems in that the deposition thickness is limited due to crystallization and the current leaks.

In particular, the electrodes are generally formed of a metal material or a metal oxide, and thus, in the instance where the interface between the inorganic material and an organic material used as a charge injection material is not stable, the performance of the device can be remarkably degraded due to the heat applied from the outside, the heat generated from the inside, or an electric field applied to the device. Therefore, the development of a material that forms a stable interface with the electrode, has a high charge transport capability, and has a predetermined molecular weight or more is required.

SUMMARY OF THE INVENTION

An object of the present invention is to provide an organic compound capable of improving the efficiency of light emission and lowering the driving voltage of an organic light emitting device, and an organic light emitting device including the same.

In one embodiment, there is an organic compound of chemical formula 1:

[Chemical formula 1]

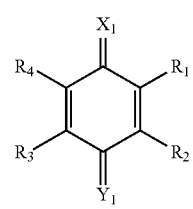

wherein $R_1$, $R_2$, $R_3$ and $R_4$ each represent, independently of each other, a hydrogen atom, a deuterium atom, —OH, —CN, —NO$_2$, —CF$_3$, a fluoroalkyl group, a halogen group, a carboxyl group, a carbonyl group, a C1-C18 substituted or unsubstituted alkyl group, a C1-C18 substituted or unsubstituted alkoxy group, a C6 or more substituted or unsubstituted aromatic group, a C5 or more substituted or unsubstituted heteroaromatic group, a C6 or more substituted or unsubstituted aryloxy group, C5 or more substituted or unsubstituted heteroaryloxy group, a C1-C18 amine group, an amine group containing a C6 or more substituted or unsubstituted aromatic group, or an amine group containing a C5 or more substituted or unsubstituted heteroaromatic group, at least one of $R_1$, $R_2$, $R_3$ and $R_4$ represent a C1-C18 substituted or unsubstituted alkyl group, a C6 or more substituted or unsubstituted aromatic group, a C5 or more substituted or unsubstituted heteroaromatic group, a C1-C18 amine group, an amine group containing a C6 or more substituted or unsubstituted aromatic group, an amine group containing a C5 or more substituted or unsubstituted heteroaromatic group, or a C1-C27 alkyl group, $X_1$ and $Y_1$ each represent, independently from each other, (a), (b), (c) or (d):

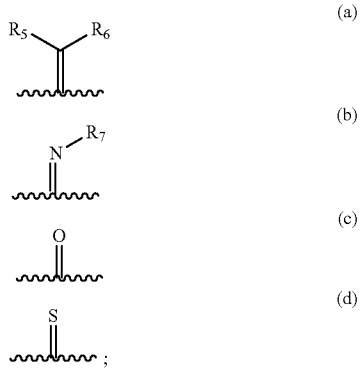

and $R_5$, $R_6$ and $R_7$ each represent, independently of each other, a hydrogen atom, a deuterium atom, —OH, —CN, —NO$_2$, —CF$_3$, a fluoroalkyl group, a halogen group, a carboxyl group, a carbonyl group, a C1-C18 substituted or unsubstituted alkyl group, a C1-C18 substituted or unsubstituted alkoxy group, a C6 or more substituted or unsubstituted aromatic group, a C6 or more substituted or unsubstituted aryloxy group, a C5 or more substituted or unsubstituted heteroaromatic group, or a C5 or more substituted or unsubstituted heteroaryloxy group, wherein $X_1$ and $Y_1$ are different each other, and wherein $R_5$ and $R_6$ are optionally linked to each other to form a ring.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF EXEMPLARY EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Figure 1:
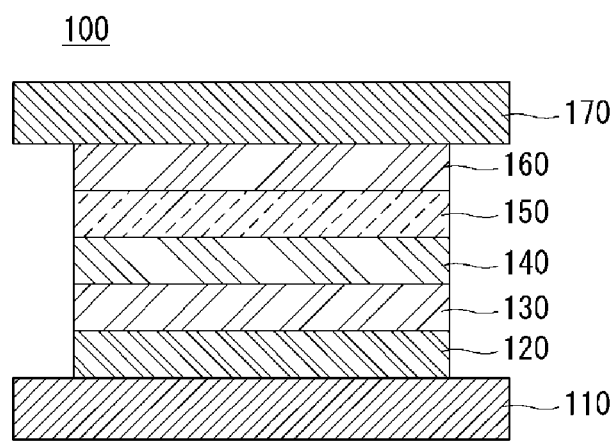
FIGS. 1 to 3 are views showing organic light emitting devices according to a first embodiment of the present invention.
Figure 2:
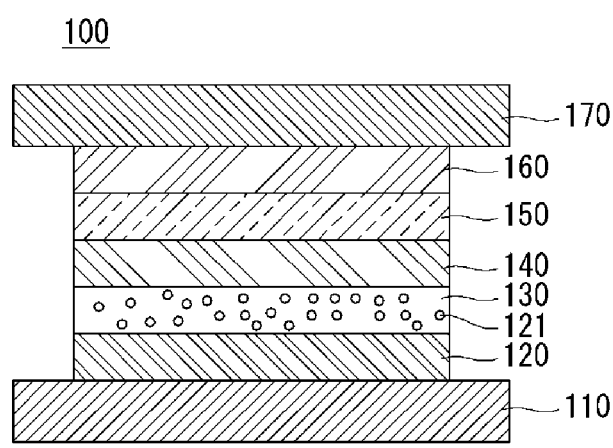
Figure 3:
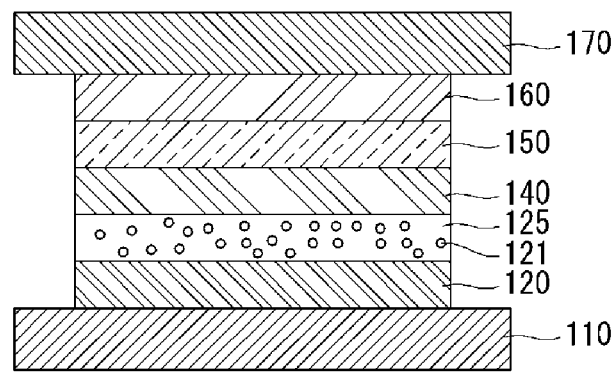

FIGS. 1 to 3 are views showing organic light emitting devices according to a first embodiment of the present invention.

Referring to FIG. 1, an organic light emitting device 100 according to a first embodiment of the present invention can include an anode 110, a hole injection layer 120, a hole transport layer 130, a light emitting layer 140, an electron transport layer 150, an electron injection layer 160, and a cathode 170.

The anode 110 is an electrode that includes holes formed by injection. The anode 110 can be made of indium tin oxide (ITO), indium zinc oxide (IZO), or zinc oxide (ZnO), which has a high work function. In the instance where the anode 110 is a reflection electrode, the anode 110 can further include a reflection layer made of aluminum (Al), silver (Ag), or nickel (Ni) on a lower surface of a layer made of ITO, IZO, or ZnO.

The hole injection layer 120 can serve to facilitate the injection of holes into the light emitting layer 140 from the anode 110. According to an embodiment of the present invention, the hole injection layer 120 can be formed by using an organic compound of chemical formula 1:

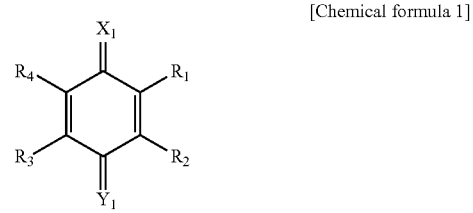

[Chemical formula 1]

wherein $R_1$, $R_2$, $R_3$ and $R_4$ each represent, independently of each other, a hydrogen atom, a deuterium atom, —OH, —CN, —NO$_2$, —CF$_3$, a fluoroalkyl group, a halogen group, a carboxyl group, a carbonyl group, a C1-C18 substituted or unsubstituted alkyl group, a C1-C18 substituted or unsubstituted alkoxy group, a C6 or more substituted or unsubstituted aromatic group, a C5 or more substituted or unsubstituted heteroaromatic group, a C6 or more substituted or unsubstituted aryloxy group, C5 or more substituted or unsubstituted heteroaryloxy group, a C1-C18 amine group, an amine group containing a C6 or more substituted or unsubstituted aromatic group, or an amine group containing a C5 or more substituted or unsubstituted heteroaromatic group. Here, at least one of $R_1$, $R_2$, $R_3$ and $R_4$ represents a C1-C18 substituted or unsubstituted alkyl group, a C6 or more substituted or unsubstituted aromatic group, a C5 or more substituted or unsubstituted heteroaromatic group, a C1-C18 amine group, an amine group containing a C6 or more substituted or unsubstituted aromatic group, an amine group containing a C5 or more substituted or unsubstituted heteroaromatic group, or a C1-C27 alkyl group.

In addition, $X_1$ and $Y_1$ each represent, independently of each other, (a), (b), (c) or (d):

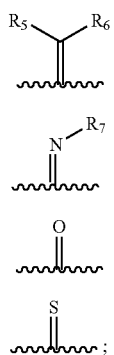

and $R_5$, $R_6$ and $R_7$ each represent, independently of each other, a hydrogen atom, a deuterium atom, —OH, —CN, —NO$_2$, —CF$_3$, a fluoroalkyl group, a halogen group, a carboxyl group, a carbonyl group, a C1-C18 substituted or unsubstituted alkyl group, a C1-C18 substituted or unsubstituted alkoxy group, a C6 or more substituted or unsubstituted aromatic group, a C6 or more substituted or unsubstituted aryloxy group, a C5 or more substituted or unsubstituted heteroaromatic group, or a C5 or more substituted or unsubstituted heteroaryloxy group, wherein $X_1$ and $Y_1$ are different each other, and wherein $R_5$ and $R_6$ are optionally linked to each other to form a ring.

The organic compound of chemical formula 1 is selected from:

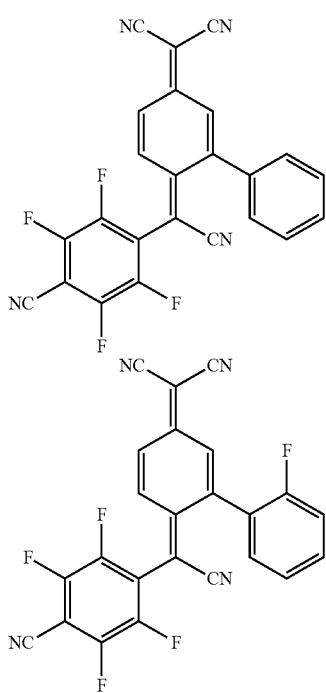

-continued

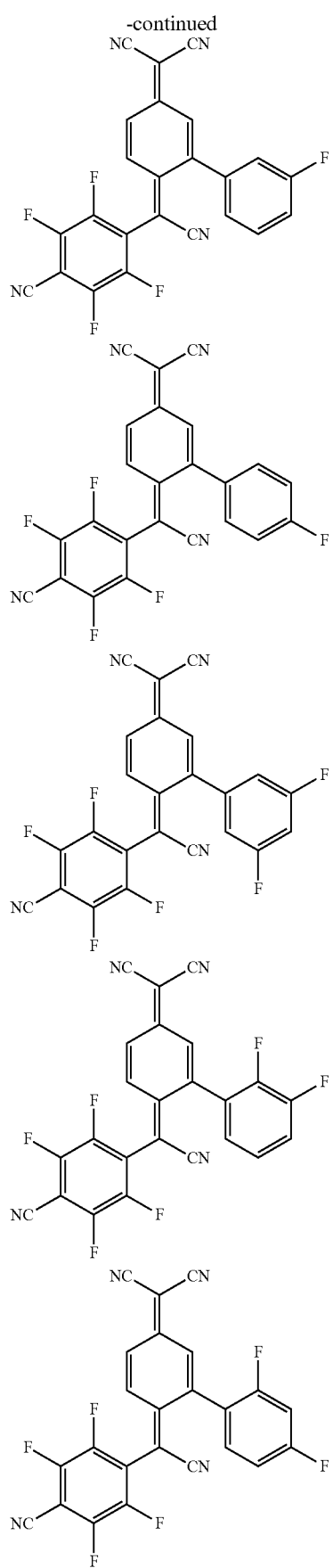

-continued
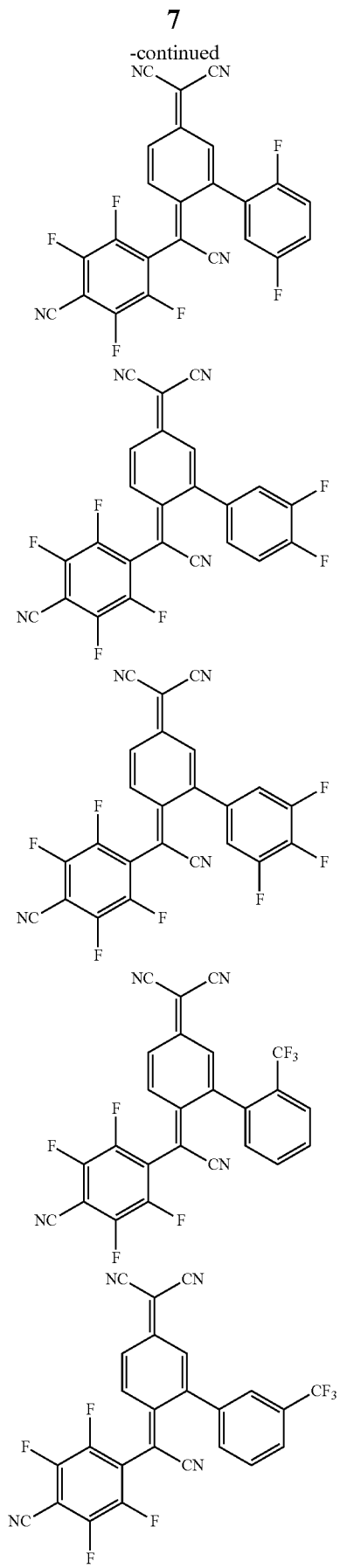
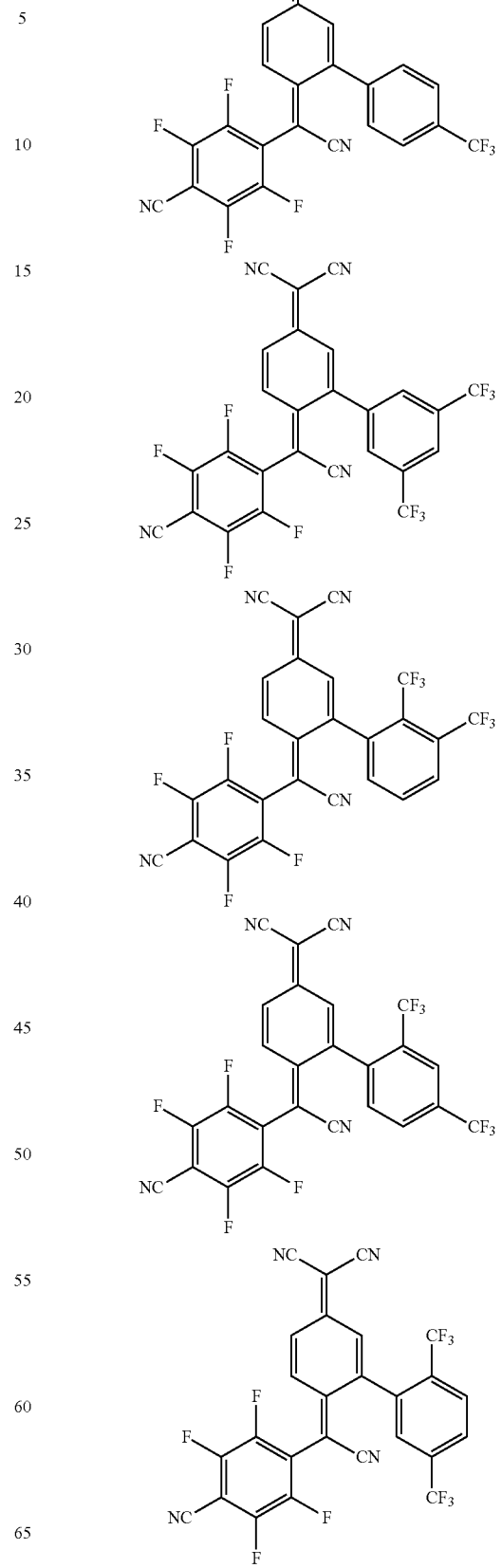

-continued
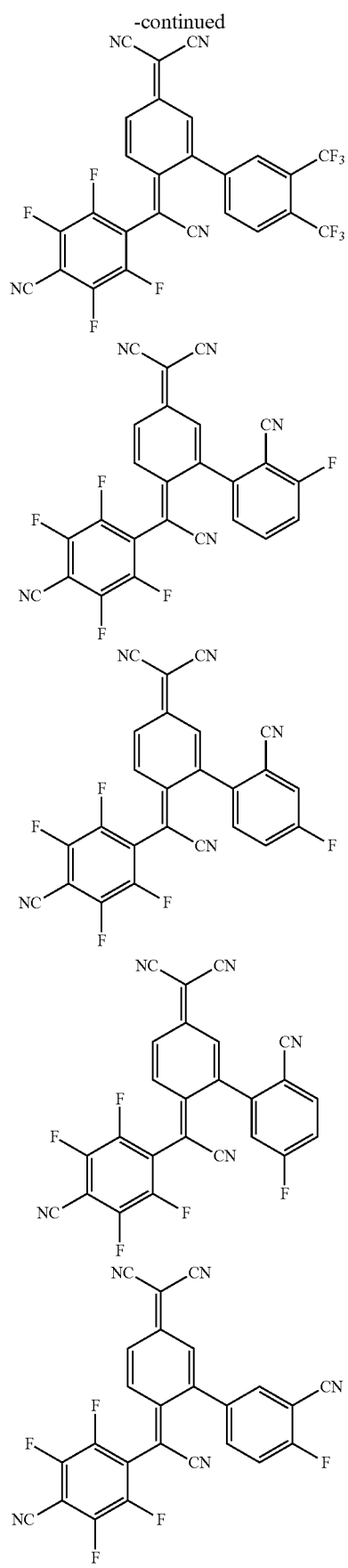
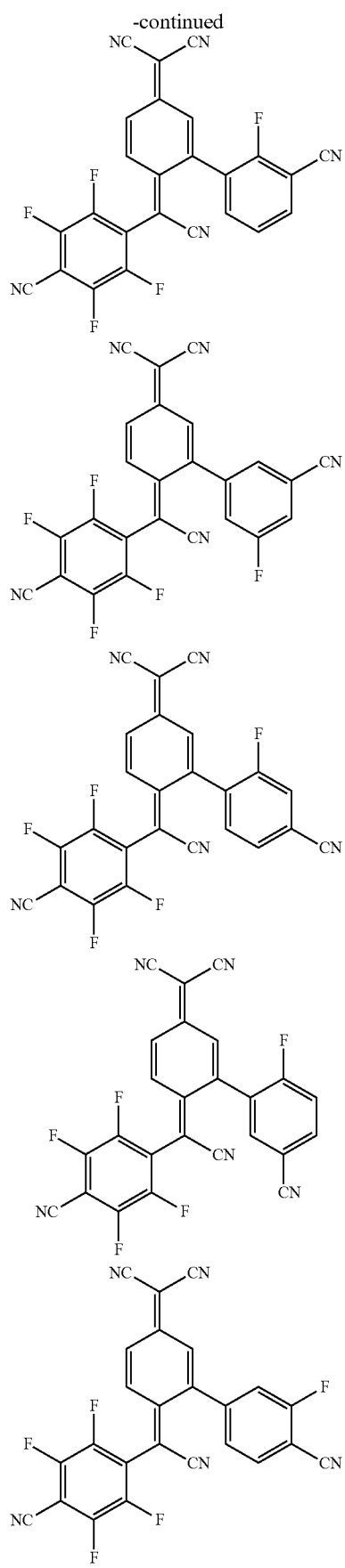

-continued
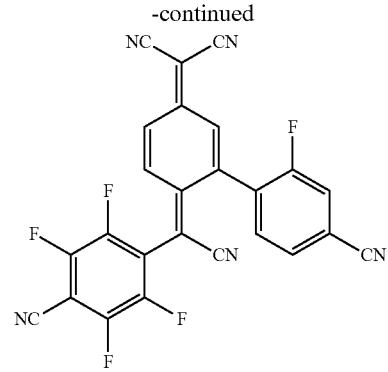
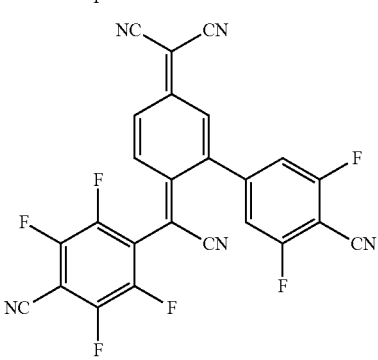
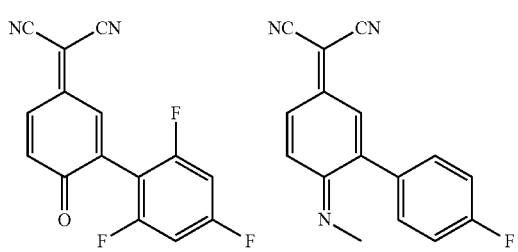
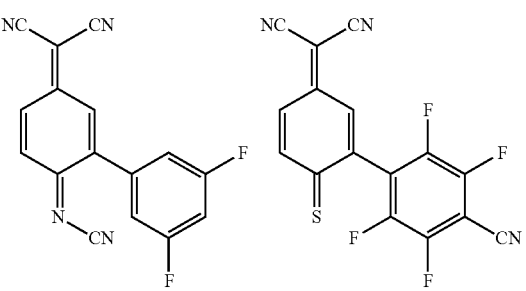
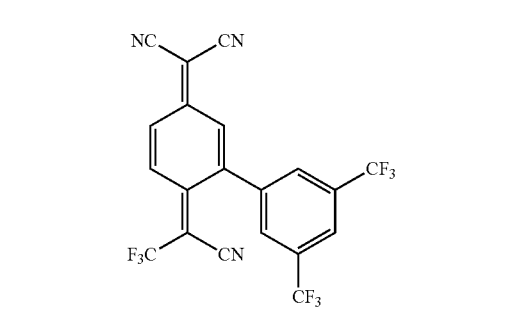
-continued
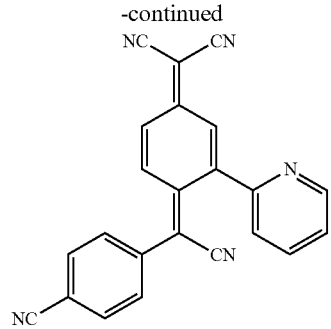
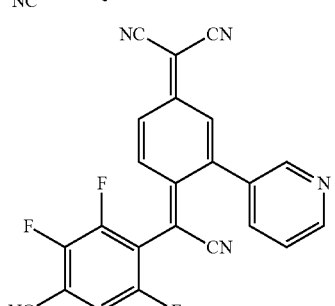
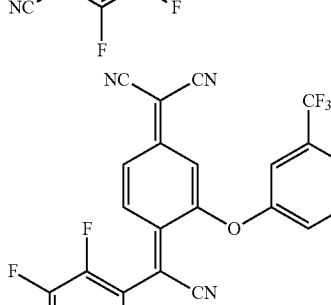
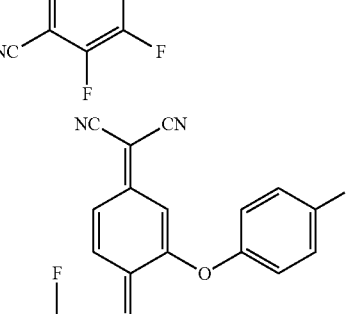
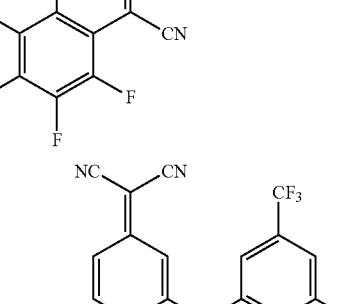

-continued
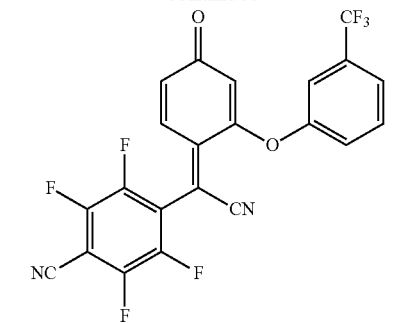
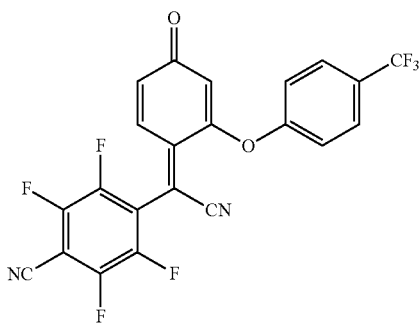
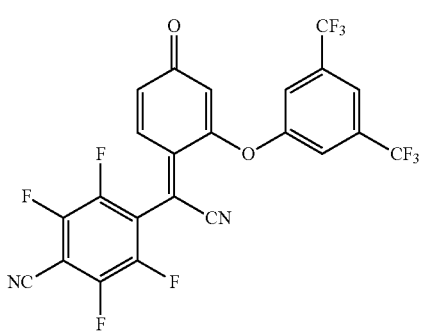
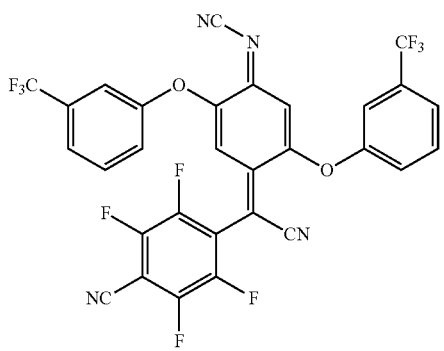
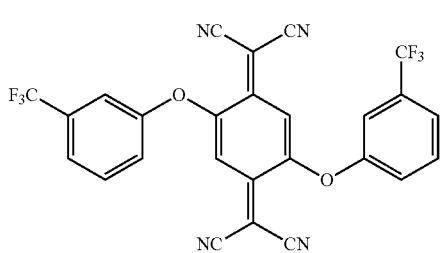
-continued
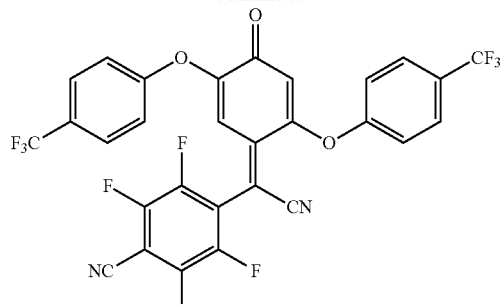
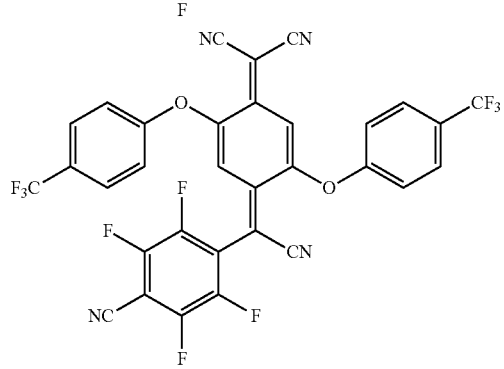
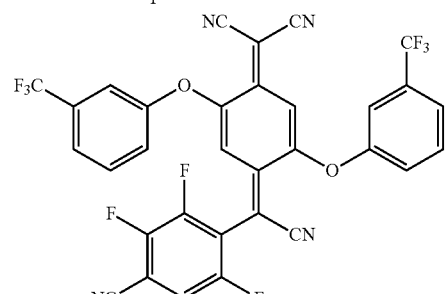
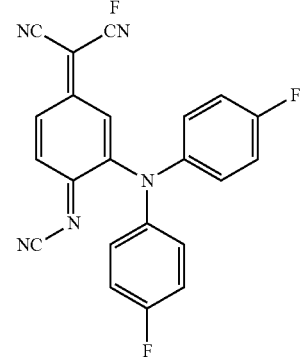
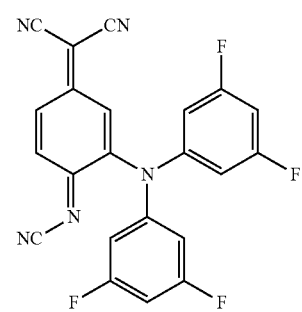

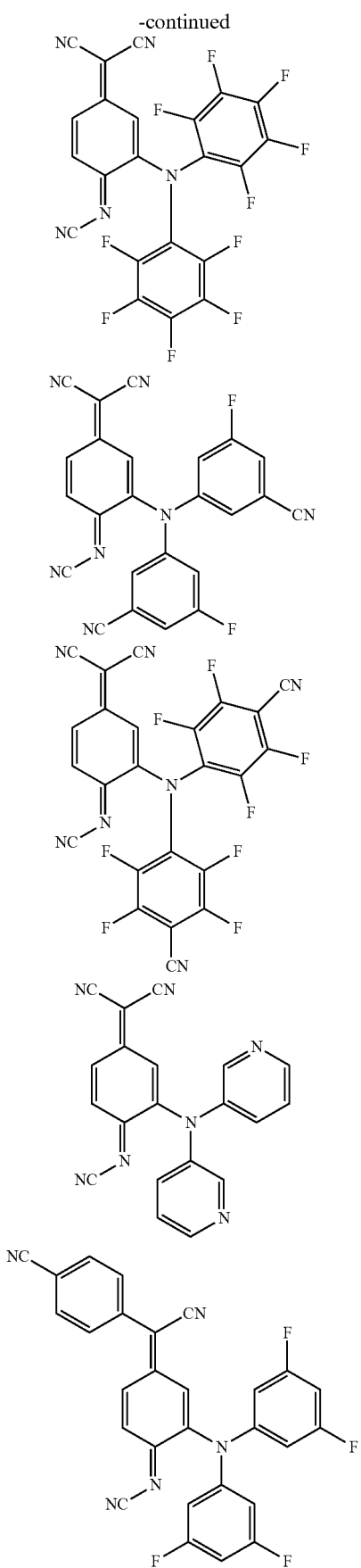

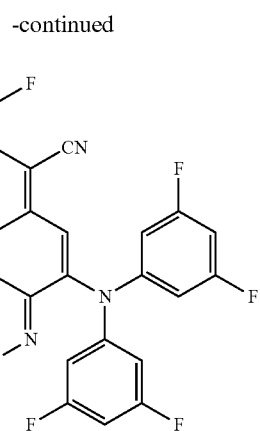

In another embodiment, the organic compound of the present invention is represented by chemical formula 2:

[chemical formula 2]

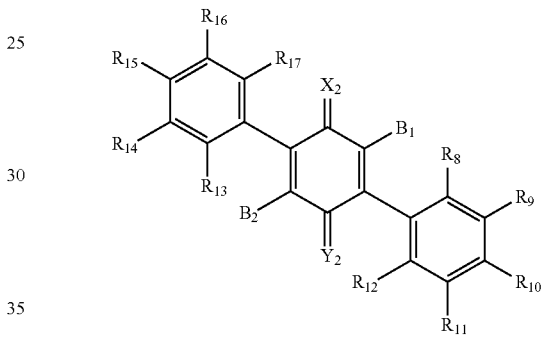

wherein $B_1$ and $B_2$ each represent, independently from each other, a hydrogen atom, a deuterium atom, —CN, —$NO_2$, —$CF_3$, —F, a fluoroalkyl group, or a halogen group; and $R_8$ to $R_{17}$ each represent, independently from each other, a hydrogen atom, a deuterium atom, —OH, —CN, —$NO_2$, —$CF_3$, a fluoroalkyl group, a halogen group, a carboxyl group, a carbonyl group, a C1-C18 substituted or unsubstituted alkyl group, a C1-C18 substituted or unsubstituted alkoxy group, a C6 or more substituted or unsubstituted aromatic group, a C5 or more substituted or unsubstituted heteroaromatic group, a C6 or more substituted or unsubstituted aryloxy group, C5 or more substituted or unsubstituted heteroaryloxy group, a C1-C18 amine group, an amine group containing a C6 or more substituted or unsubstituted aromatic group, an amine group containing a C5 or more substituted or unsubstituted heteroaromatic group, a silyl group containing a C1-C27 alkyl group or a C6 or more substituted or unsubstituted aromatic group, or a silyl group containing a C5 or more substituted or unsubstituted heteroaromatic group, and at least one of $R_8$ to $R_{17}$ represents —CN, —$NO_2$, —$CF_3$, —F, or a fluoroalkyl group.

In addition, $X_2$ and $Y_2$ each represent, independently from each other, (e), (f), (g) or (h):

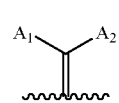

(e)

-continued

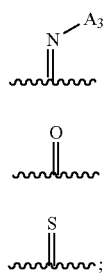

and

A$_1$ to A$_3$ each represent, independently from each other, a hydrogen atom, a deuterium atom, —OH, —CN, —NO$_2$, —CF$_3$, a fluoroalkyl group, a halogen group, a carboxyl group, a carbonyl group, a C1-C18 substituted or unsubstituted alkyl group, a C1-C18 substituted or unsubstituted alkoxy group, a C6 or more substituted or unsubstituted aromatic group, a C6 or more substituted or unsubstituted aryloxy group, a C5 or more substituted or unsubstituted heteroaromatic group, or a C5 or more substituted or unsubstituted heteroaryloxy group, and A$_1$ and A$_2$ are optionally linked to each other to form a ring.

The organic compound is selected from:

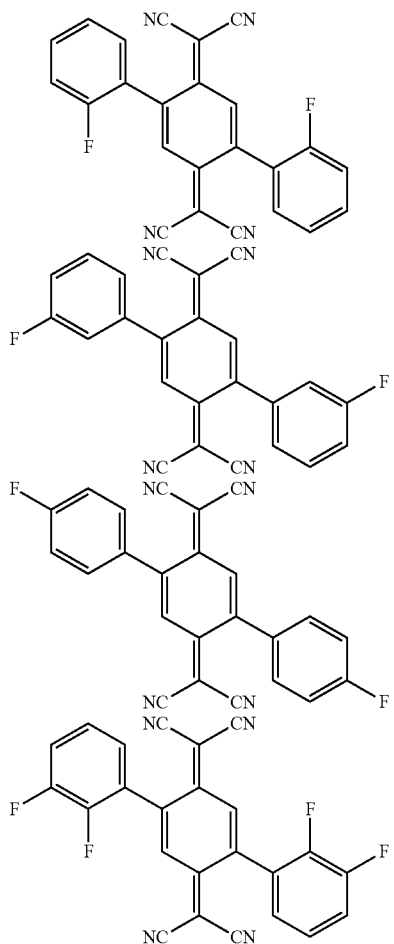

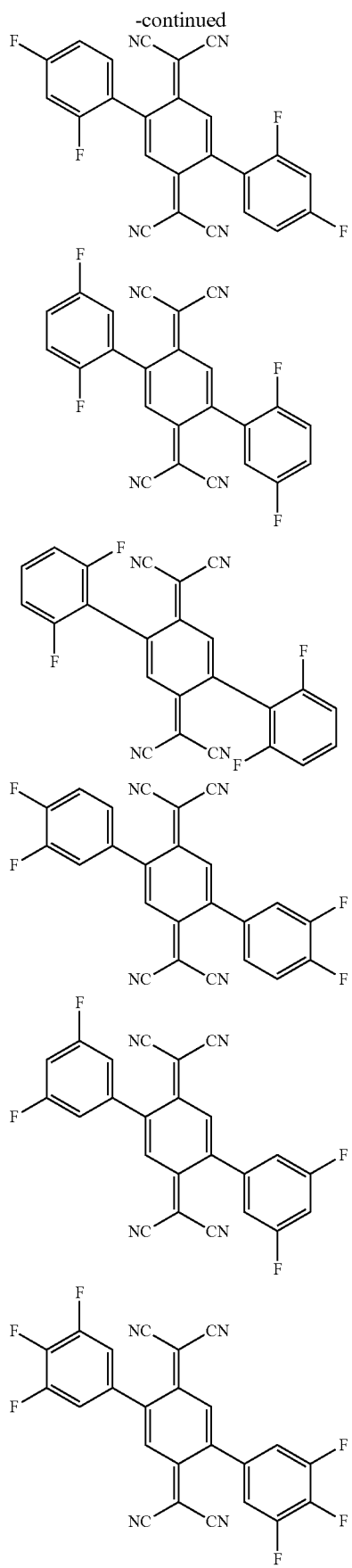

-continued
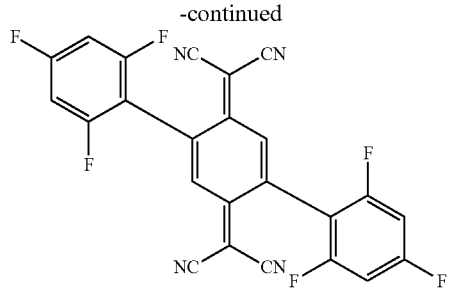
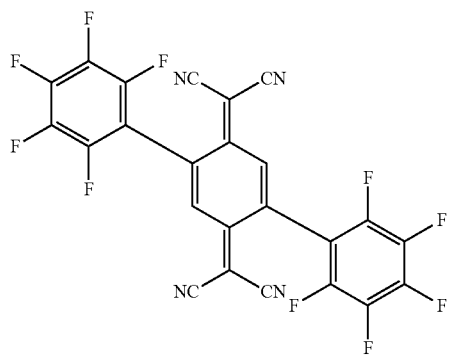
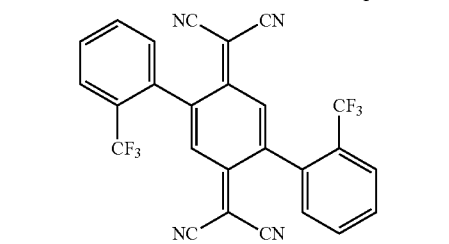
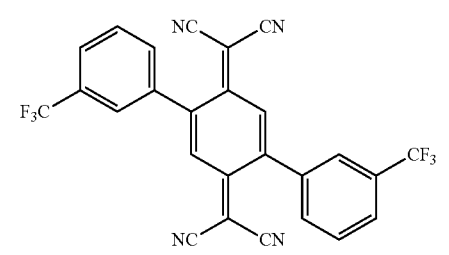
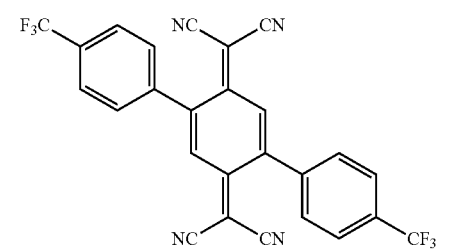
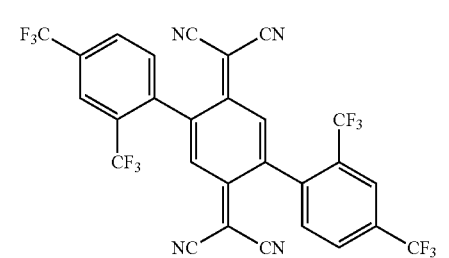
-continued
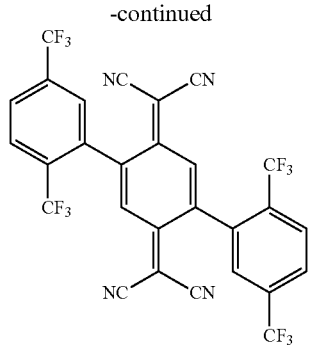
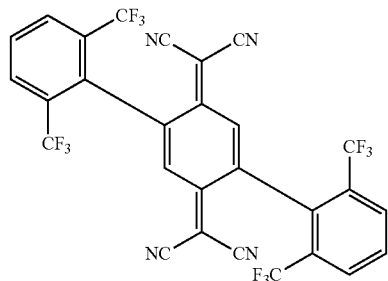
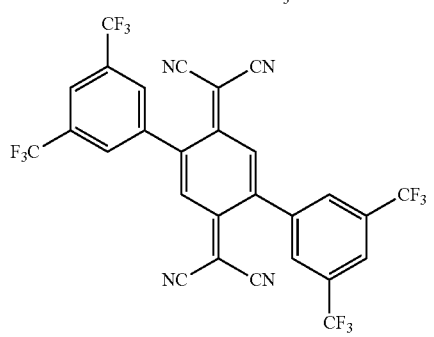
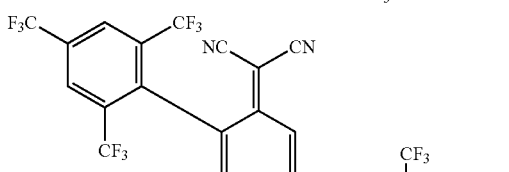
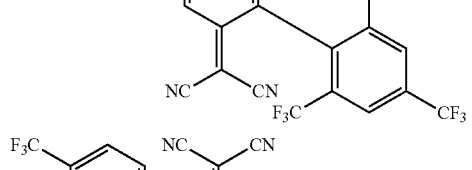
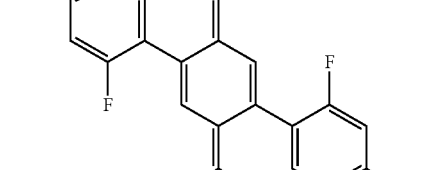
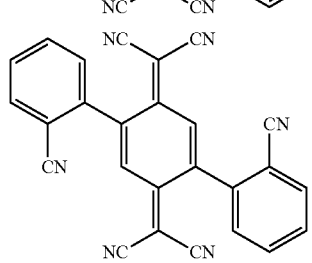

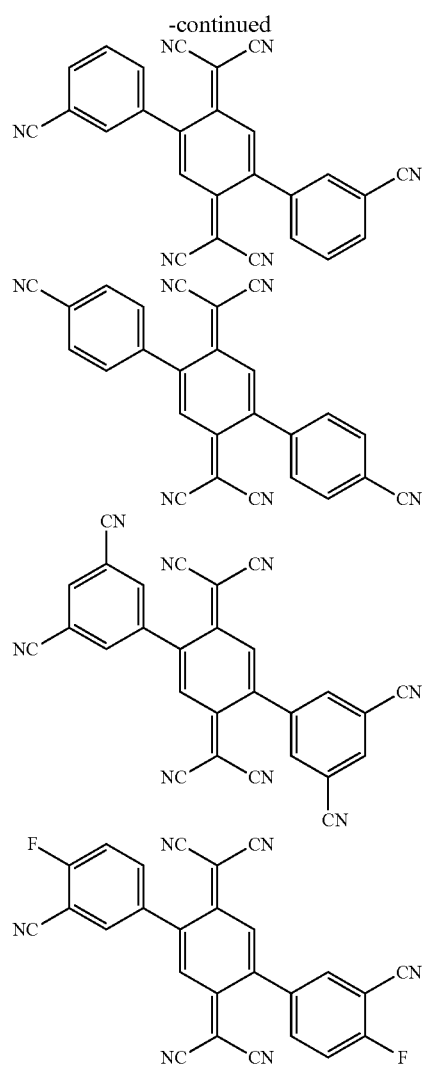
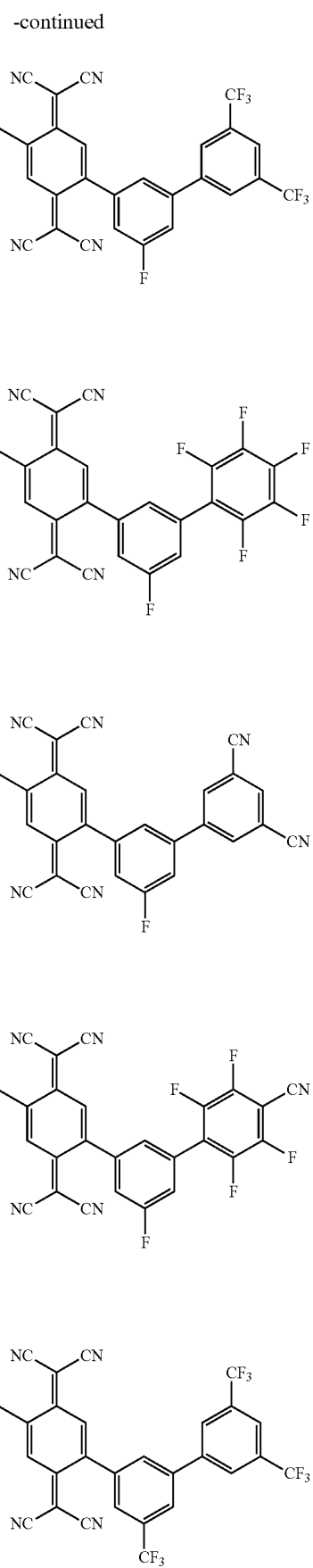

-continued
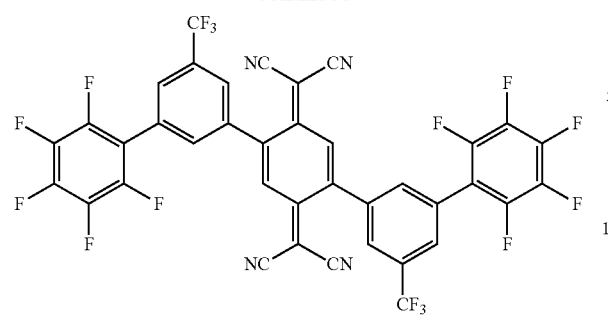
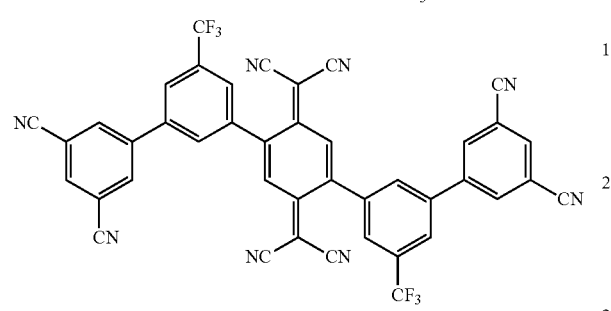
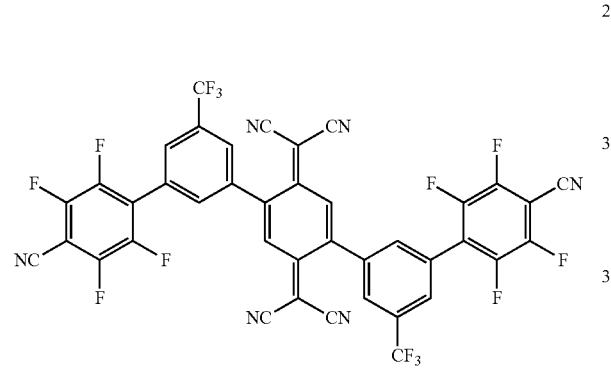
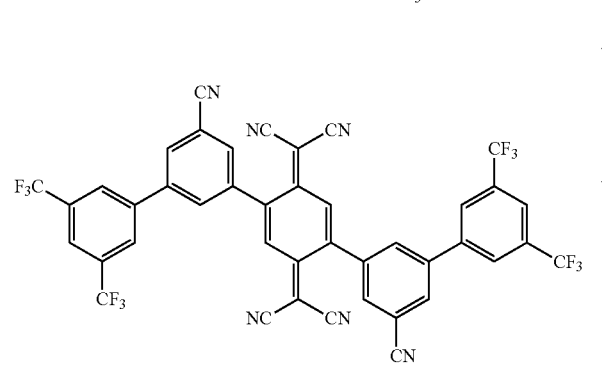
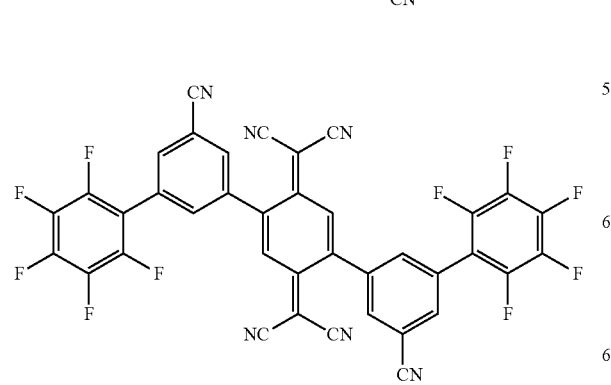
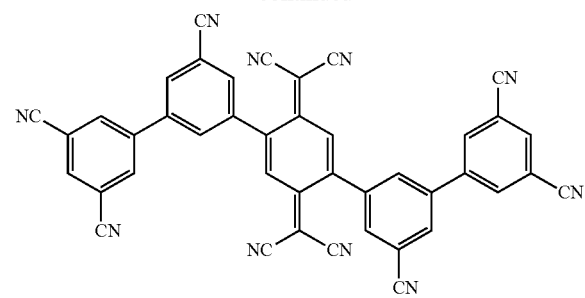
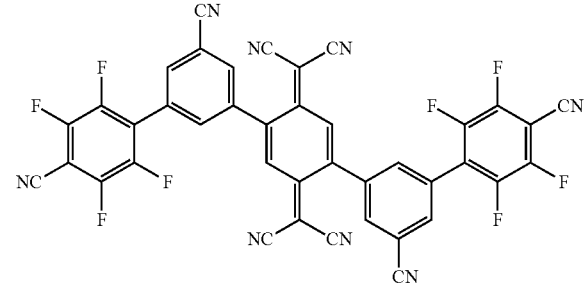
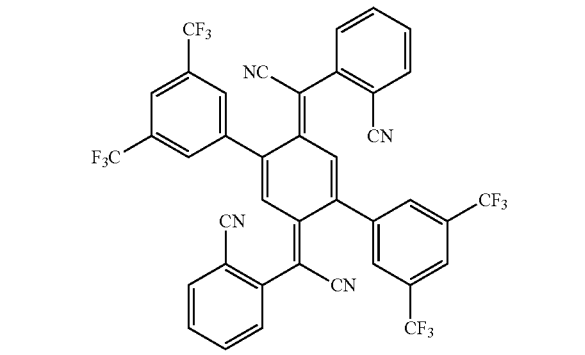
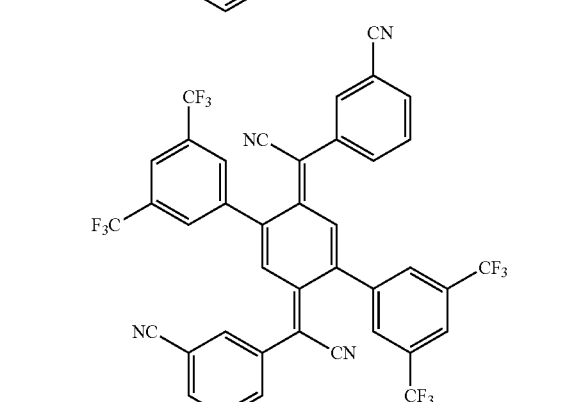
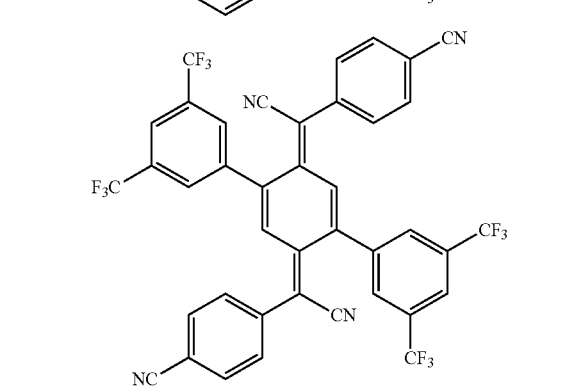

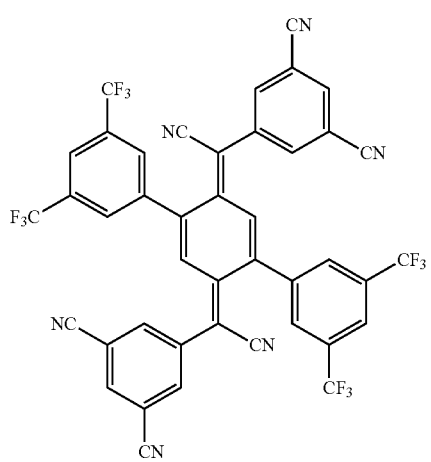
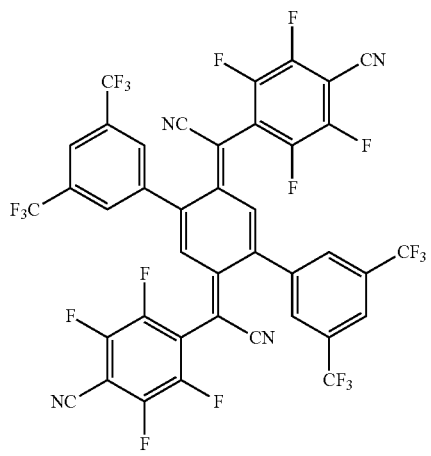
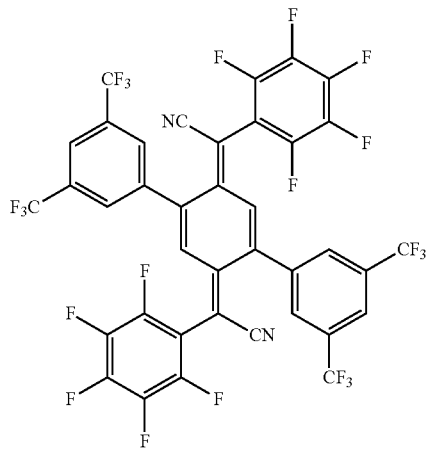
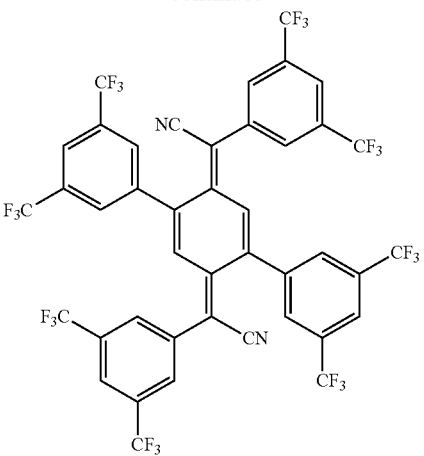
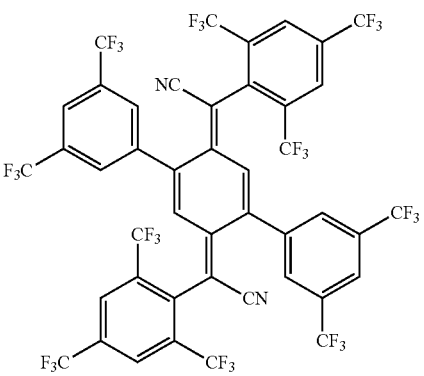
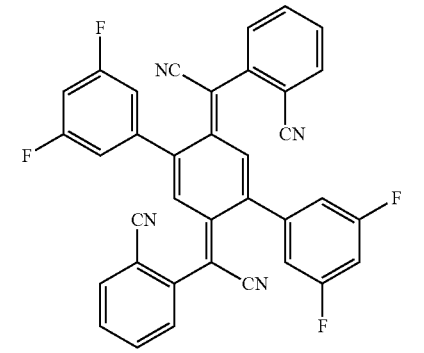
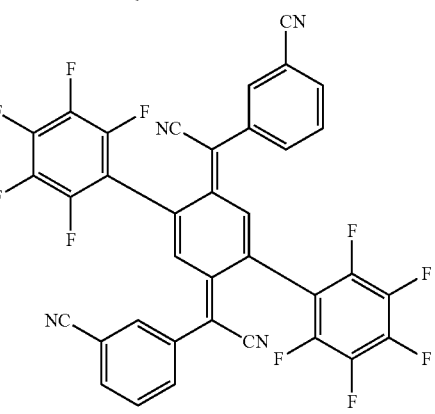

27
-continued
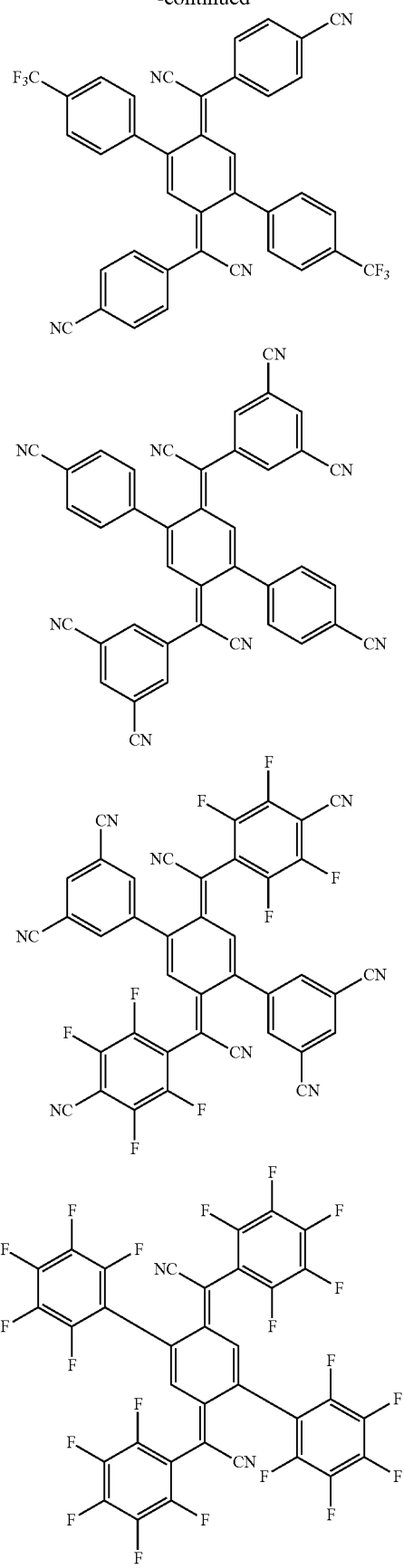
28
-continued
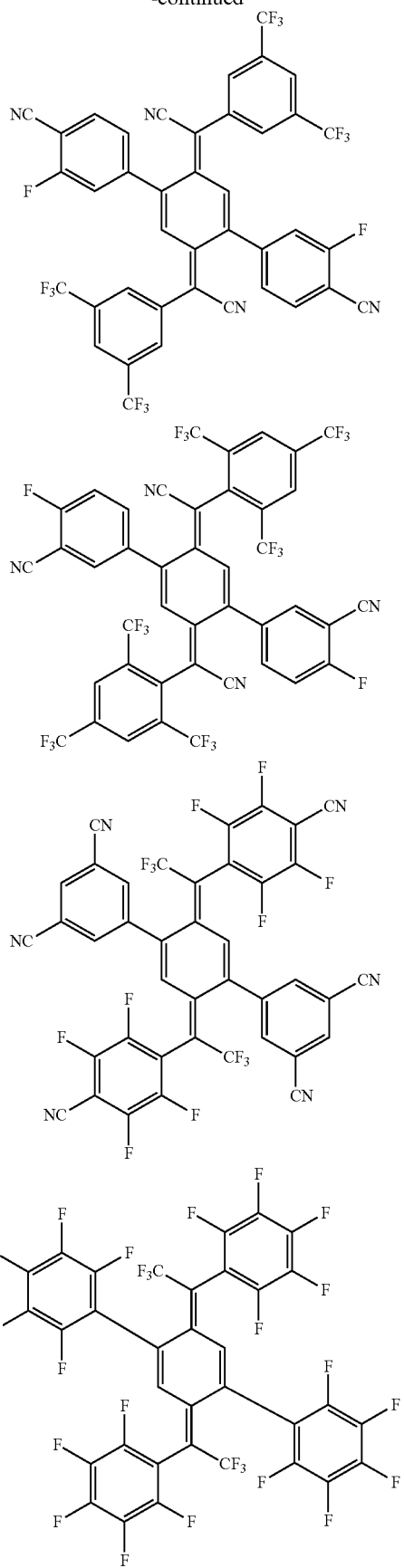

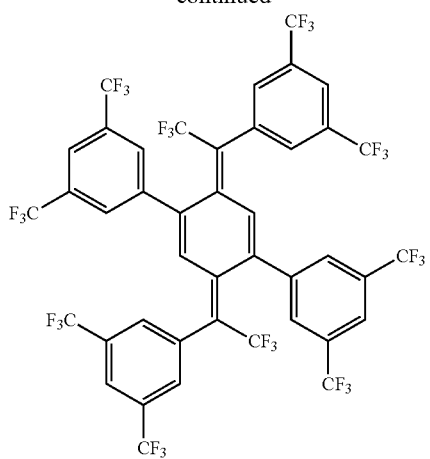
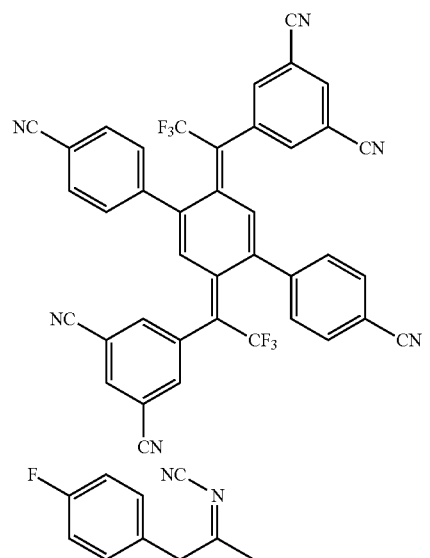
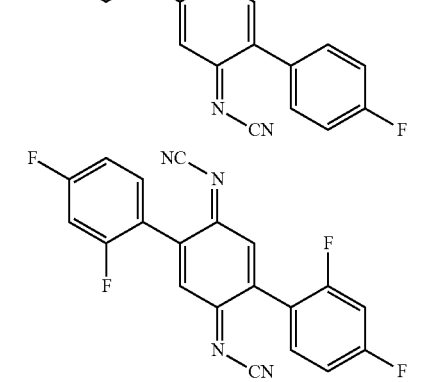
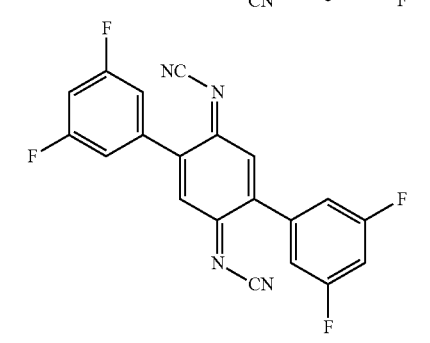
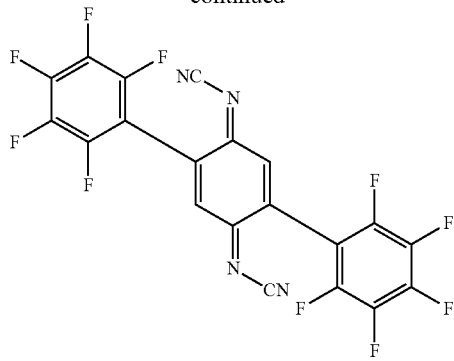
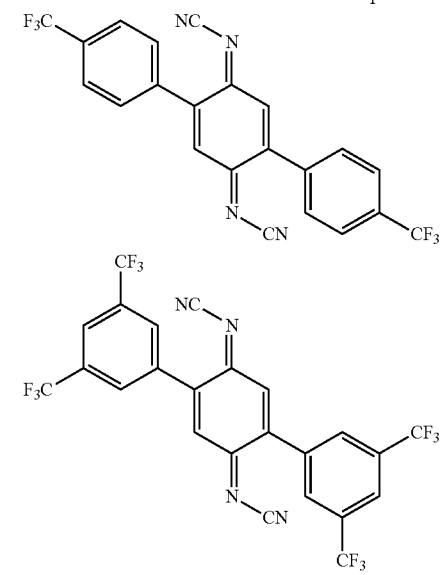
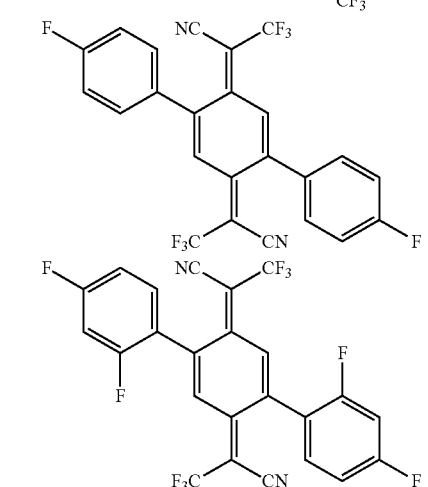
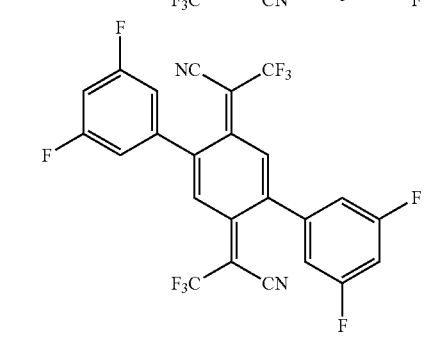

31
-continued
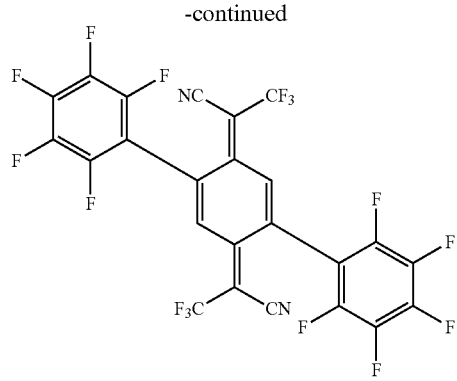
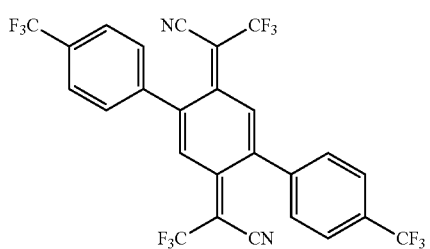
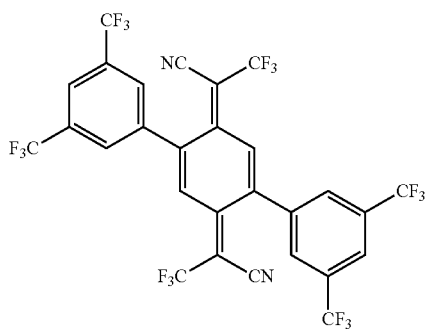
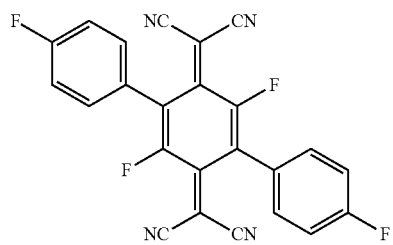
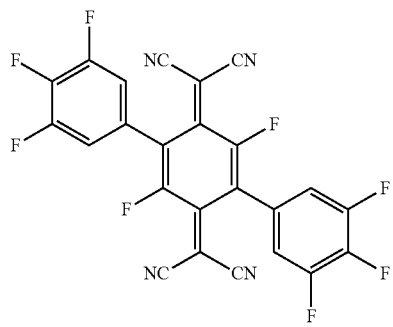
32
-continued
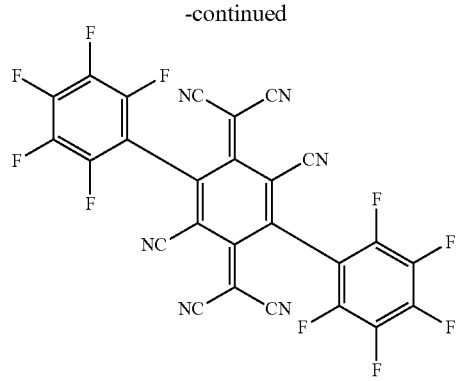
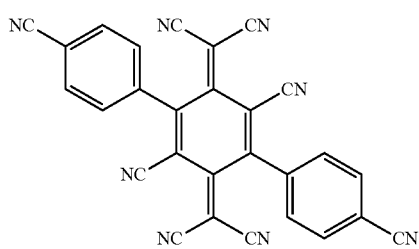
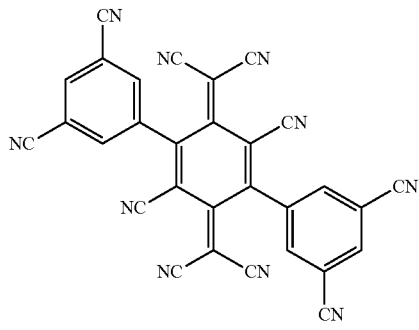
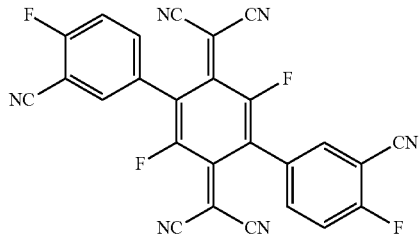
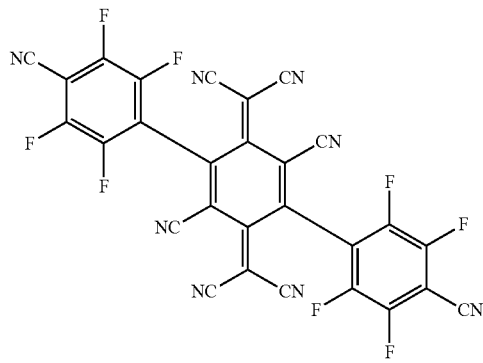

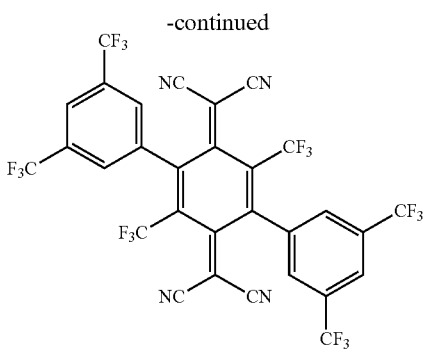

The above-described organic compound provides an organic light emitting device capable of increasing power efficiency, improving power consumption, and lowering the driving voltage by introducing a substituent having an electron accepting capacity to a benzoquinone derivative.

The thickness of the hole injection layer 120 can be 1 to 150 nm. Here, if the thickness of the hole injection layer 120 is 1 nm or greater, the structural characteristics of the hole injection can avoid deterioration, and if the thickness of the hole injection is 150 nm or smaller, the hole injection layer 120 is too thick, which prevents a rise in the driving voltage that improves the movement of holes.

The hole transport layer 130 can facilitate the transport of holes, and can be formed of at least one selected from the group consisting of NPD (N,N-dinaphthyl-N,N'-diphenyl benzidine), TPD (N,N-bis-(3-methylphenyl)-N,N-bis-(phenyl)-benzidine), s-TAD, and MTDATA (4,4',4"-Tris(N-3-methylphenyl-N-phenyl-amino)-triphenylamine), but is not limited thereto. The thickness of the hole transport layer 130 can be 1 to 150 nm. Here, if the thickness of the hole transport layer 130 is 5 nm or greater, the structural characteristics of the hole transport can avoid deterioration, and if the thickness of the hole transport is 150 nm or less, the hole transport layer 130 is too thick, which prevents a rise in the driving voltage that improves the movement of holes.

The light emitting layer 140 can emit red (R), green (G), and blue (B) lights, and can be formed of a phosphorescent material or a fluorescent material.

In the instance where the light emitting layer 140 is red, the light emitting layer 140 can include a host material including CBP (carbazole biphenyl) or mCP (1,3-bis(carbazol-9-yl) and can be formed of a phosphorescent material including at least one dopant selected from PIQIr(acac)(bis (1-phenylisoquinoline)acetylacetonate iridium), or PQIr (acac)(bis(1-phenylquinoline)acetylacetonate iridium). In another embodiment, the light emitting layer 140 can be formed of a fluorescent material including PBD:Eu(DBM) 3(Phen) or perylene, but is not limited thereto.

In the instance where the light emitting layer 140 is green, the light emitting layer can include a host material including CBP or mCP, and can be formed of a phosphorescent material including a dopant of Ir(ppy)$_3$ (fac-tris(2-phenylpyridine)iridium). In another embodiment, the light emitting layer 140 can be formed of a fluorescent material including Alq$_3$ (tris(8-hydroxyquinolino)aluminum), but is not limited thereto.

In the instance where the light emitting layer 140 is blue, the light emitting layer can include a host material including CBP or mCP and can be formed of a phosphorescent material including a dopant of (4,6-F$_2$ppy)$_2$Irpic. In other embodiment, the light emitting layer 140 can be formed of a fluorescent material including any one selected from the group consisting of spiro-DPVBi, Spiro-6P, DSB (distyryl benzene), DSA (distyryl arylene), PFO-based polymers, and PPV-based polymers, but is not limited thereto The electron transport layer 150 serves to facilitate the transport of electrons, and can be formed of at least one selected from the group consisting of Alq3 (tris(8-hydroxyquinolino)aluminum), PBD, TAZ, spiro-PBD, BAlq, and SAlq, but is not limited thereto. The thickness of the electron transport layer 150 can be 1 to 50 nm. Here, if the thickness of the electron transport layer 150 is 1 nm or greater, the structural characteristics of the electron transport can avoid deterioration, and if the thickness of the hole transport layer is 50 nm or smaller, the electron transport layer 150 is too thick, which prevents a rise in the driving voltage that improves the movement of electrons.

The electron injection layer 160 serves to facilitate the injection of electrons, and can be formed of Alq3 (tris(8-hydroxyquinolino)aluminum), PBD, TAZ, spiro-PBD, BAlq, or SAlq, but is not limited thereto. The electron injection layer 160 can be formed of a metal compound, for example, at least one selected from the group consisting of LiQ, LiF, NaF, KF, RbF, CsF, FrF, BeF$_2$, MgF$_2$, CaF$_2$, SrF$_2$, BaF$_2$, and RaF$_2$, but is not limited thereto. The thickness of the electron injection layer 160 can be 1 to 50 nm. Here, if the thickness of the electron injection layer 160 is 1 nm or greater, the structural characteristics of the electron transport can avoid deterioration, and if the thickness of the electron injection layer is 50 nm or smaller, the electron injection layer 160 is too thick, which prevents a rise in the driving voltage that improves the movement of electrons.

The cathode 170 is an electron injection electrode, and can be formed of magnesium (Mg), calcium (Ca), aluminum (Al), silver (Ag), or an alloy thereof, which has a low work function. In this instance, where the organic light emitting device has a top emission type structure or a dual-emission type structure, the cathode 170 can be formed to have a thin thickness so that it cannot be transmitted by the light.

The organic light emitting device shown in FIG. 1 includes a hole injection layer formed of an organic compound of the present invention. Whereas, referring to FIG. 2, an organic compound 121 of the present invention can be doped in a hole transport layer 130. Here, the organic compound 121 is doped in the hole transport layer 130 at a doping concentration of 0.1 to 50%. A hole injection layer 120 can be formed of CuPc (cupper phthalocyanine), PEDOT (poly(3,4)-ethylenedioxythiophene), PANI (polyaniline), or NPD (N,N-dinaphthyl-N,N'-diphenyl benzidine).

Referring to FIG. 3, an organic compound 121 of the present invention can be contained in a hole buffer layer 125 disposed between a hole injection layer 120 and a hole transport layer. The hole buffer layer 125 can be formed of only the organic compound 121, or can be formed by doping the organic compound 121 in a host material. Here, the host material of the hole buffer layer 125 has hole characteristics, and can use, for example, a hole transport layer material, but is not limited thereto. The hole buffer layer 125 is disposed between the hole injection layer 120 and the hole transport layer 130 and functions as a buffer layer. Although not shown in the drawings, the hole buffer layer 125 is contacted with an anode 110 and is positioned between the anode 110 and the hole transport layer 130. The hole buffer layer 125 can be formed in a structure in which the hole injection layer 120 is omitted.

As described above, the organic compound of the present invention is applied to the hole injection layer, the hole transport layer, and the hole buffer layer, thereby providing an organic light emitting device capable of increasing power efficiency, improving power consumption, and lowering the driving voltage.

Figure 4:
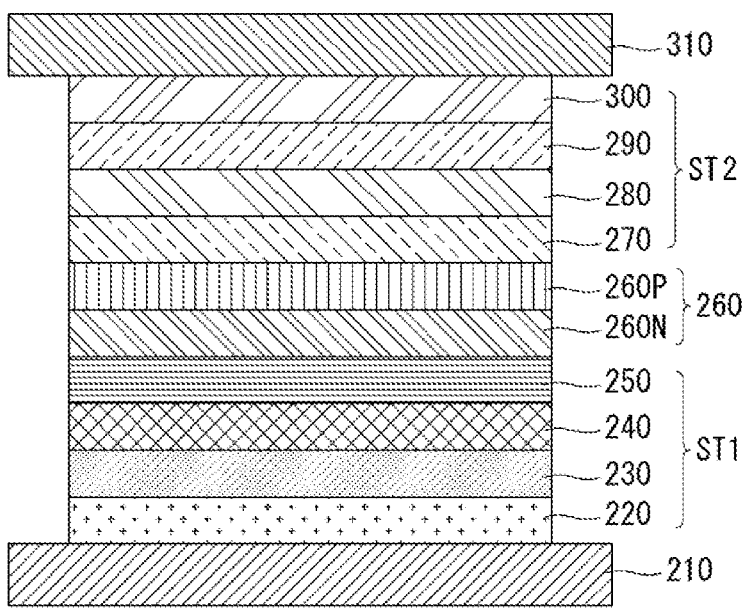
FIGS. 4 to 6 are views showing organic light emitting devices according to a second embodiment of the present invention.
Figure 5:
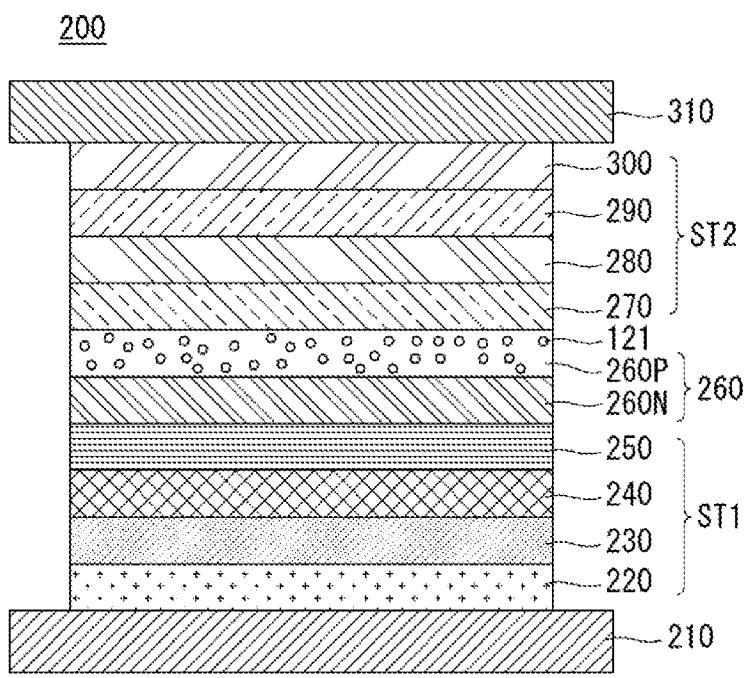
Figure 6:
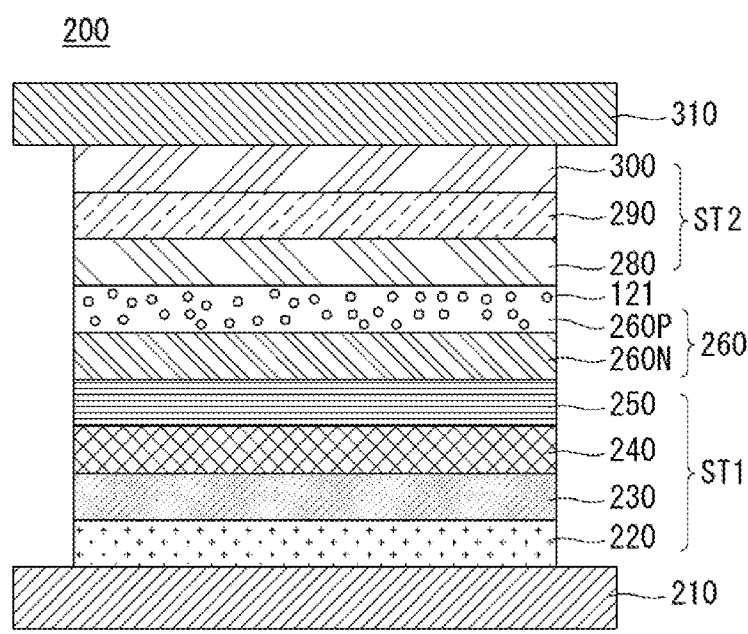

FIGS. 4 to 6 are views of organic light emitting devices according to a second embodiment of the present invention. Hereinafter, descriptions of the same components as in the first embodiment are omitted.

Referring to FIG. 4, the organic light emitting device 200 of the present invention includes stacks ST1 and ST2 disposed between an anode 210 and a cathode 310 and a charge generation layer between the stacks ST1 and ST2. In this embodiment, two stacks are disposed between an anode 210 and a cathode 310, but is not limited thereto. Thus, three, four, or more stacks can be included between the anode 210 and the cathode 310.

More specifically, the first stack ST1 constitutes one light emission unit, and includes a first light emitting layer 240. The first light emitting layer 240 can emit a red light, a green light, or a blue light. In the present embodiment, the first light emitting layer 240 can be a blue light emitting layer. The first stack ST1 further includes a hole injection layer 220 and a first hole transport layer 230 disposed between the anode 210 and the first light emitting layer 240. The hole injection layer 220 can facilitate the injection of holes into the first light emitting layer 240 from the anode 210. The hole injection layer 220 can be formed of at least one selected from the group consisting of cupper phthalocyanine (CuPc), poly(3,4)-ethylenedioxythiophene (PEDOT), polyaniline (PANT), and N,N-dinaphthyl-N,N'-diphenyl benzidine (NPD), but is not limited thereto.

The first hole transport layer 230 has the same structure as the hole transport layer of the first embodiment. In addition, the first stack ST1 further includes a first electron transport layer 250 on the first light emitting layer 240. The first electron transport layer 250 has the same structure as the electron transport layer of the first embodiment. Therefore, the first stack ST1 including the hole injection layer 220, the first hole transport layer 230, the first light emitting layer 240, and the first electron transport layer 250 is disposed on the anode 210.

A charge generation layer (CGL) 260 is disposed on the first stack ST1. The charge generation layer 260 can be a PN junction charge generation layer including an N-type charge generation layer 260N and a P-type charge generation layer 160P that are joined to each other. Here, the PN junction charge generation layer 260 generates charges or separates them into holes and electrons, and then injects the charges into the respective light emitting layers. That is, the N-type charge generation layer 260N supplies electrons to the first light emitting layer 240 adjacent to the anode, and the P-type charge generation layer 260P supplies holes to a light emitting layer of the second stack ST2, thereby further improving the efficiency of light emission of the organic light emitting device including a plurality of light emitting layers and lowering the driving voltage together.

Here, the P-type charge generation layer 260P is formed of the foregoing organic compound of chemical formula 1 or 2. The organic compound is the same material as in the first embodiment, and thus descriptions thereof are omitted. The organic compound used in the P-type charge generation layer 260P has excellent electron accepting capacity, thereby providing an organic light emitting device capable of increasing power efficiency, improving power consumption, and lowering the driving voltage.

The N-type charge generation layer 260N can be formed of a metal or an N-type doped organic material. Here, the metal can be one material selected from the group consisting of Li, Na, K, Rb, Cs, Mg, Ca, Sr, Ba, La, Ce, Sm, Eu, Tb, Dy, and Yb. In addition, as an N-type dopant used in the N-type doped organic material and a host material, a material that can be conventionally used therefor can be used. For example, the N-type dopant can be an alkali metal, an alkali metal compound, an alkali earth metal, or an alkali earth metal compound. Specifically, the N-type dopant can be one selected from the group consisting of Cs, K, Rb, Mg, Na, Ca, Sr, Eu, and Yb. The host material can be one material selected from the group consisting of tris(8-hydroxyquinoline) aluminum, triazine, a hydroxyquinoline derivative, a benz-azole derivative, and a silole derivative.

Further, the second stack ST2 including a second light emitting layer 290 is disposed on the charge generation layer 260. The second light emitting layer 290 can emit a red light, a green light, or a blue light. For example, in the present embodiment, the second light emitting layer 290 can be a yellow light emitting layer emitting a yellow light. The second light emitting layer 290 can be formed in a light emitting layer emitting a yellow-green light, or in a multi-layer structure of a yellow-green light emitting layer and a light emitting layer emitting a green light. The present embodiment includes a single layer structure of a yellow light emitting layer emitting a yellow-green light. The second light emitting layer 290 can be formed of at least one host selected from CBP (4,4'-N,N'-dicarbazolebiphenyl) and Balq (Bis(2-methyl-8-quinlinolato-N1,O8)-(1,1'-Biphenyl-4-olato)aluminium), and a yellow-green phosphorescent dopant emitting a yellow-green light.

The second stack (ST2) further includes a second electron transport layer 270 and an electron block layer 280 disposed between the charge generation layer 260 and the second light emitting layer 290. The second electron transport layer 270 has the same structure as the first hole transport layer 230 as described above. The electron block layer 280 contains a material of the hole transport layer and metal or a metal compound to prevent the electrons generated from the light emitting layer from going to the hole transport layer. Thus, the LUMO level of the electron block layer is raised, so that electrons cannot go over the electron block layer.

In addition, the second stack ST2 further includes a second electron transport layer 300 on the second light emitting layer 290. The second electron transport layer 300 has the same structure as the first electron transport layer 250 as described above. Therefore, the second stack ST2 includes the second electron transport layer 270, the electron block layer 280, the second light emitting layer 290, and the second electron transport layer 300. The second stack ST2 is disposed on the charge generation layer 260. The cathode 310 is provided on the second stack ST2, thereby manufacturing an organic light emitting device according to a second embodiment of the present invention.

The organic light emitting device in which the P-type charge generation layer 260P is formed of the organic compound of the present invention is shown in FIG. 4 and is described above. Whereas, referring to FIG. 5, an organic compound 121 of the present invention can be doped in a P-type charge generation layer 260P formed of a host material. That is, the P-type charge generation layer 260P can be formed of the host material and the organic compound 121. The host material has been described in the first embodiment, and thus descriptions thereof will be omitted. Here, the organic compound 121 is doped in the P-type charge generation layer 260P at a doping concentration of 0.1 to 50%.

Referring to FIG. 6, the organic compound 121 of the present invention is doped in the P-type charge generation layer 260P, and here, the hole transport layer can be omitted between the P-type charge generation layer 260P and the electron block layer 280.

In accordance with a second embodiment of the present invention, the organic compound of the present invention is used for the P-type charge generation layer of the organic light emitting device, but the organic compound can be further used for the hole injection layer formed in the first stack of the second embodiment, like the first embodiment. That is, the structure of the foregoing embodiment can be combined with the second embodiment of the present invention.

Hereinafter, synthetic examples of the organic compound and the organic light emitting device using the same according to the present invention will be described in the following synthetic examples and examples. However, the following examples are merely for illustrating the present invention and are not intended to limit the scope of the present invention.

Synthetic Example

1) Preparation of Compound A-1

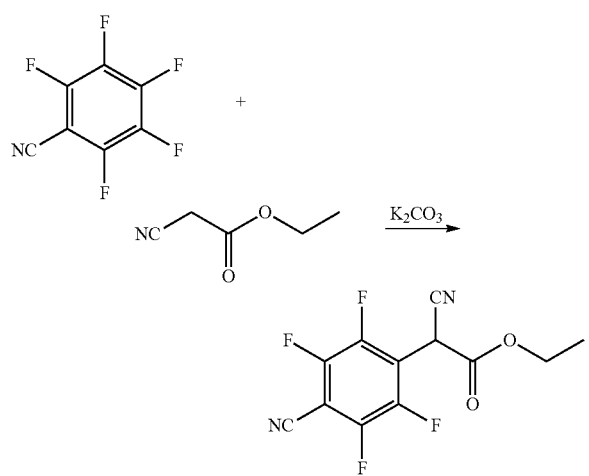

In a 500 ml two-neck flask, 2,3,4,5,6-pentafluorobenzonitrile (20 g, 103.5 mmol), potassium carbonate (17.2 g, 124.3 mmol), and ethyl cyanoacetate (11.7 g, 103.5 mmol) were added into 200 ml of dimethylformamide (DMF), then stirred at room temperature for 48 hours. Distilled water and acetic acid were added dropwise in the mixture to terminate the reaction, then extracted with dichloromethane and concentrated to obtain compound A-1 29. 3 g (99%) as a yellow viscous liquid.

2) Preparation of Compound A-2

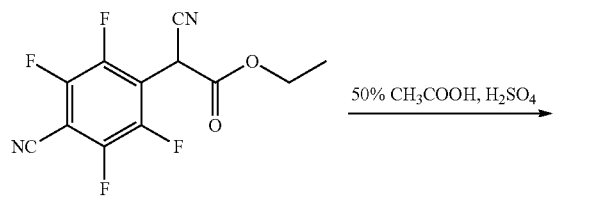

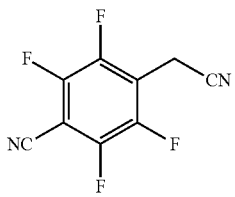

Compound A-1 (29.3 g, 102.4 mmol), 50% acetic acid (42 ml), and sulfuric acid (2.08 ml) were added in a 250 ml two-neck flask, refluxed for 16 hours and then stirred. After the mixture was cooled to room temperature, 60 ml of cool distilled water was added dropwise to terminate the reaction, then stirred for 30 minutes. The mixture was subjected to extraction with distilled water and chloroform, then concentrated to obtain compound A-2 21.3 g (95%) as a yellow-white solid.

3) Preparation of Compound A-3

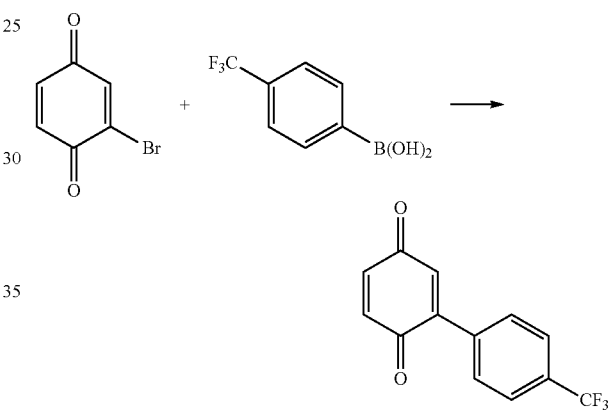

In a 500 ml two-neck flask, 2-bromo-1,4-benzoquinone (3.14 g, 16.8 mmol), 4-(trifluoromethyl)phenyl boronic acid (3.2 g, 16.8 mmol), tetrakis(triphenylphosphine)palladium (0) (1.0 g, 0.84 mmol), and potassium carbonate (7.0 g, 50.6 mmol) were added into a mixed solution of 1,4-dioxane (120 ml) and water (40 ml), then refluxed for 40 minutes and then stirring. The reaction was terminated, then extracted with water and dichloromethane and then subjected to column chromatography using dichloromethane and n-hexane, thereby obtaining compound A-3 1.4 g (33%).

4) Preparation of Compound A-4

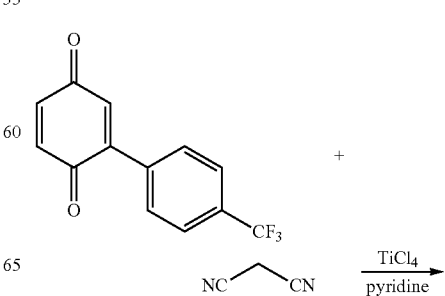

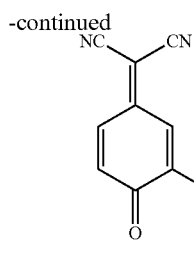

Compound A-3 (1.4 g, 5.6 mmol) and malononitrile (0.55 g, 8.4 mmol) were added into a 250 ml two-neck flask, and then dissolved in 250 ml of dichloromethane, and titanium (IV)chloride (0.93 ml, 8.4 mmol) and pyridine (1.36 ml, 16.8 mmol) were slowly added dropwise at −78° C. Then, the mixture was stirred at room temperature for 3 hours. Distilled water was added dropwise to terminate the reaction under the ice bath, followed by work up with distilled water and dichloromethane and then subjected to column chromatography with dichloromethane and hexane to obtain compound A-3 0.73 g (44%).

5) Preparation of Compound a

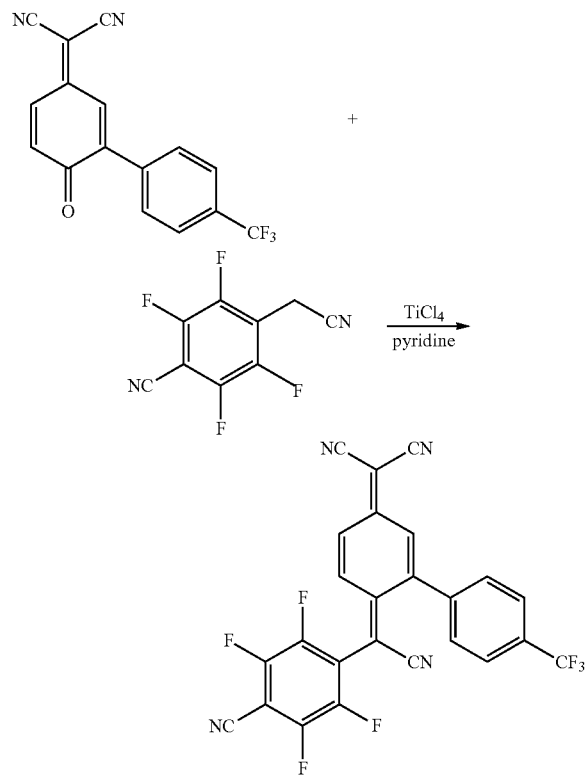

Compound A-4 (0.7 g, 2.33 mmol) and compound A-2 (4.99 g, 23.3 mmol) were added into a 500 ml two-neck flask, and then dissolved in 250 ml of dichloromethane, and titanium(IV)chloride (2.56 ml, 23.3 mmol) and pyridine (3.8 ml, 46.6 mmol) were slowly added dropwise at −78° C. Then, the mixture was refluxed for 16 hours and stirred. Distilled water was added dropwise to terminate the reaction under the ice bath, followed by work up with distilled water and dichloromethane and then subjected to column chromatography with dichloromethane and hexane to obtain compound A 0.48 g (42%).

6) Preparation of Compound B-1

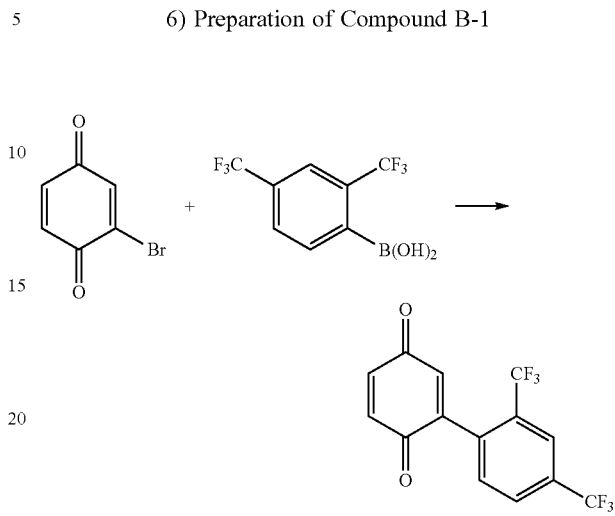

In a 500 ml two-neck flask, 2-bromo-1,4-benzoquinone (3.14 g, 16.8 mmol), bis(trifluoromethyl)phenyl boronic acid (4.3 g, 16.8 mmol), tetrakis(triphenylphosphine)palladium(0) (1.0 g, 0.84 mmol), and potassium carbonate (7.0 g, 50.6 mmol) were added into a mixed solution of 1,4-dioxane (120 ml) and water (40 ml), then refluxed for 40 minutes and then stirred. The reaction was terminated, extracted with water and dichloromethane and then subjected to column chromatography using dichloromethane and n-hexane to obtain compound B-1 1.6 g (30%).

7) Preparation of Compound B-2

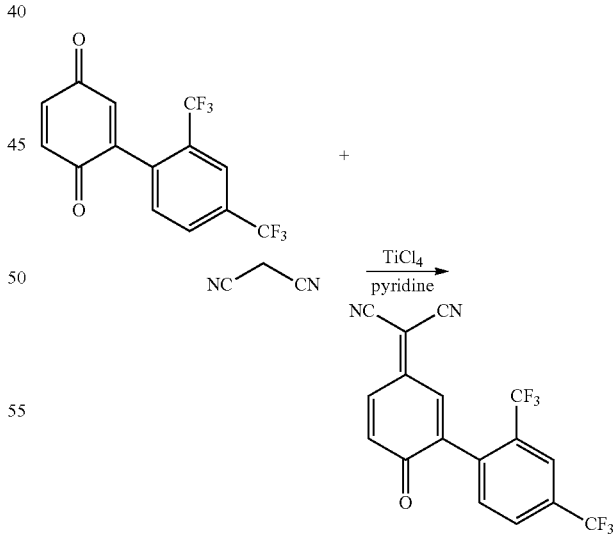

Compound B-1 (1.6 g, 5.0 mmol) and malononitrile (0.5 g, 7.5 mmol) were added into a 250 ml two-neck flask, and then dissolved in 250 ml of dichloromethane, and titanium (IV)chloride (0.83 ml, 7.5 mmol) and pyridine (1.2 ml, 15.0 mmol) were slowly added dropwise at −78° C. Then, the mixture was stirred at room temperature for 12 hours.

Distilled water was added dropwise to terminate the reaction under the ice bath, followed by work up with distilled water and dichloromethane and then subjected to column chromatography with dichloromethane and hexane to obtain compound B-2 0.77 g (42%).

8) Preparation of Compound B

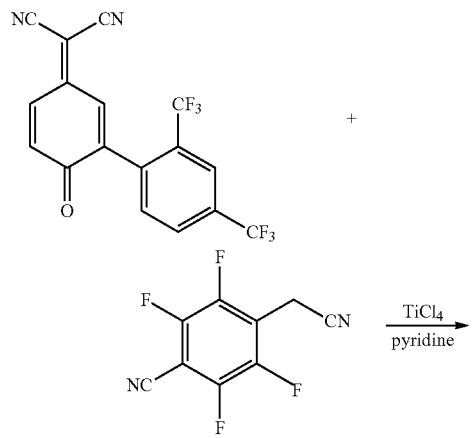

Compound B-2 (0.77 g, 2.1 mmol) and compound A-2 (4.48 g, 20.9 mmol) were added into a 500 ml two-neck flask, and then dissolved in 250 ml of dichloromethane, and titanium(IV)chloride (2.3 ml, 20.9 mmol) and pyridine (3.4 ml, 41.8 mmol) were slowly added dropwise at −78° C. Then, the mixture was refluxed for 16 hours and stirred. Distilled water was added dropwise to terminate the reaction under the ice bath, followed by work up with distilled water and dichloromethane and then subjected to column chromatography with dichloromethane and hexane to obtain compound B 0.45 g (38%).

9) Preparation of Compound A3

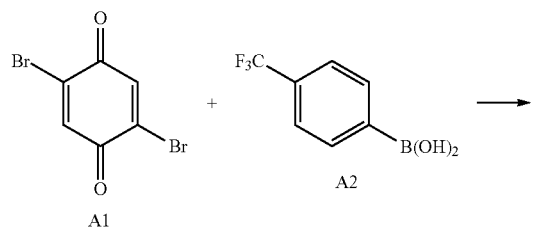

In a 500 ml round-bottom flask, compound A (3.00 g, 11.28 mmol), compound A2 (4.71 g, 24.82 mmol), tetrakis(triphenylphosphine)palladium(0) (1.30 g, 1.13 mmol), and potassium carbonate (13.72 g, 99.28 mmol) were added into a mixed solution of tetrahydrofurane (150 ml) and water (50 ml), then refluxed for 4 hours at 80° C. The reaction was terminated, then extracted with water and ethyl acetate, concentrated, and then subjected to column separation using methylene chloride and n-hexane. Then, a precipitation liquid was formed by using methylene chloride and petroleum ether, then filtered to obtain compound A3 (1.72 g, 4.34 mmol).

10) Preparation of Compound A5

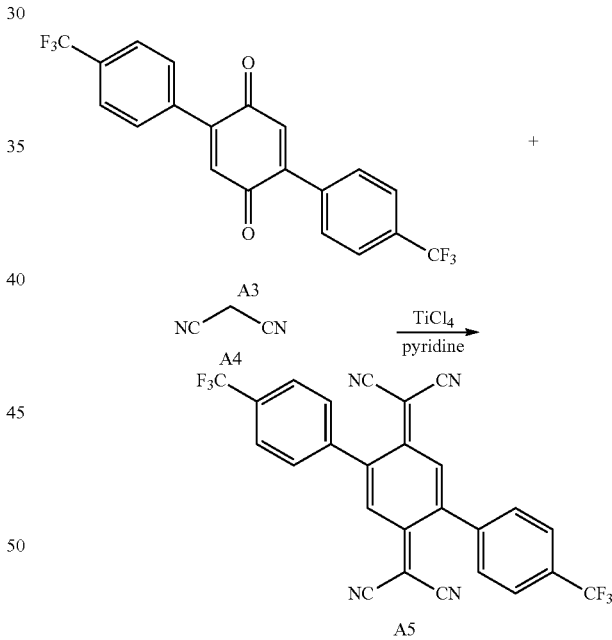

In a 500 ml round-bottom flask, compound A3 (1.72 g, 4.34 mmol) and compound A4 (2.87 g, 43.40 mmol) were added into methylene chloride (250 ml), and the mixture was cooled to 0° C. Then, titanium chloride (4.76 ml, 43.40 mmol) and pyridine (6.99 ml, 86.81 mmol) were slowly and sequentially added dropwise, then stirred at 60° C. for 24 hours. The reaction was terminated, then extracted with water and methylene chloride, concentrated, and then subjected to column separation using methylene chloride, ethyl acetate, and n-hexane. Then, a precipitation liquid was formed by using methylene chloride and petroleum ether, then filtered to obtain compound A5 (0.38 g, 0.77 mmol).

11) Preparation of Compound B3

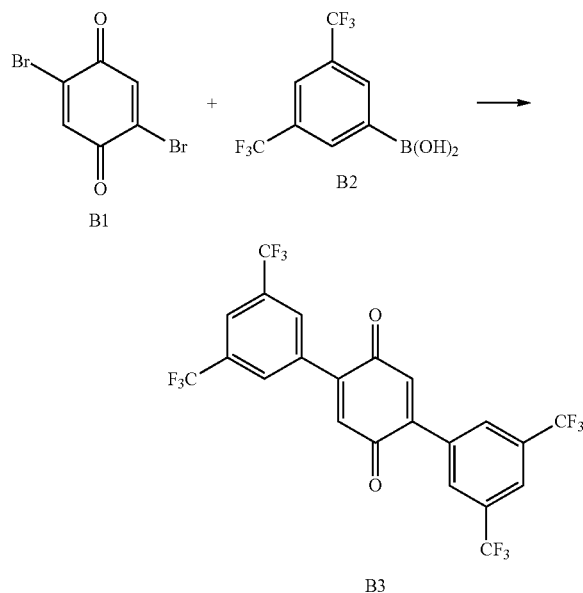

In a 500 ml round-bottom flask, compound B1 (3.00 g, 11.28 mmol), compound B2 (6.40 g, 24.82 mmol), tetrakis(triphenylphosphine)palladium(0) (1.30 g, 1.13 mmol), and potassium carbonate (13.72 g, 99.29 mmol) were added into a mixed solution of tetrahydrofurane (150 ml) and water (50 ml), followed by stirring at 80° C. for 4 hours. The reaction was terminated, extracted with water and ethyl acetate, concentrated, and then subjected to column separation using methylene chloride and n-hexane. Then, a precipitation liquid was formed by using methylene chloride and petroleum ether, then filtered to obtain compound B3 (1.65 g, 3.10 mmol).

12) Preparation of Compound B5

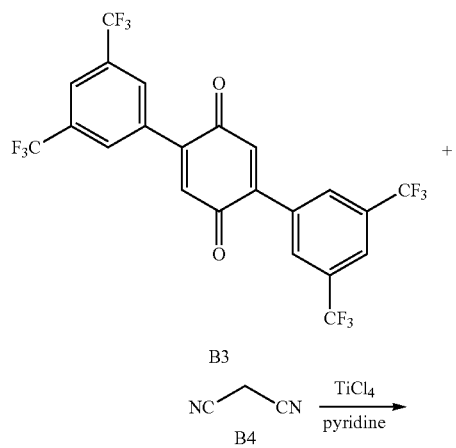

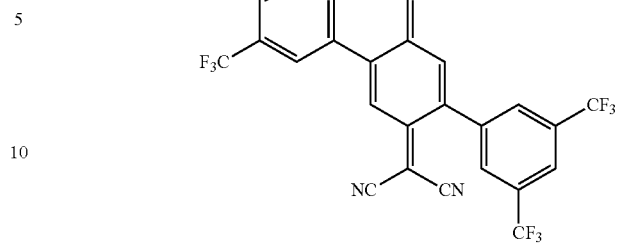

In a 500 ml round-bottom flask, compound B3 (1.65 g, 3.10 mmol) and compound B4 (2.05 g, 31.00 mmol) were added into methylene chloride (250 ml), and the mixture was cooled to 0° C. Then, titanium chloride (3.40 ml, 31.00 mmol) and pyridine (4.99 ml, 62.00 mmol) were slowly and sequentially added dropwise, then stirred at 60° C. for 24 hours. The reaction was terminated, extracted with water and methylene chloride, concentrated, and then subjected to column separation using methylene chloride, ethyl acetate, and n-hexane. Then, a precipitation liquid was formed by using methylene chloride and petroleum ether, then filtered to obtain compound B5 (0.48 g, 0.76 mmol).

13) Preparation of Compound C3

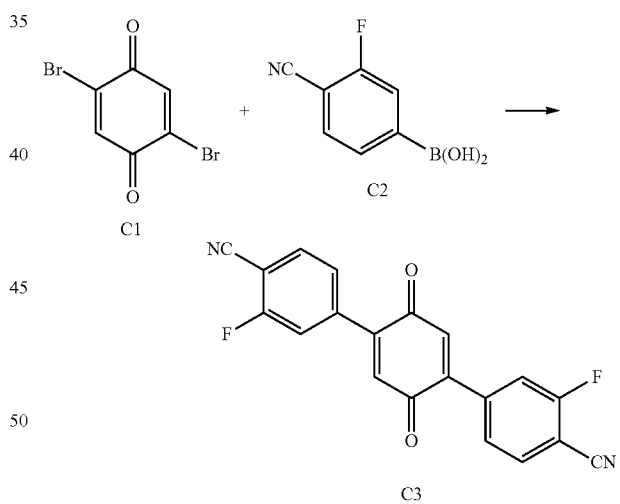

In a 500 ml round-bottom flask, compound C1 (4.50 g, 16.92 mmol), compound C2 (6.14 g, 37.23 mmol), tetrakis(triphenylphosphine)palladium(0) (1.96 g, 1.69 mmol), and potassium carbonate (20.58 g, 148.93 mmol) were added into a mixed solution of tetrahydrofurane (180 ml) and water (60 ml), then stirred at 80° C. for 4 hours. The reaction was terminated, extracted with water and ethyl acetate, concentration, and then subjected to column separation using methylene chloride and n-hexane. Then, a precipitation liquid was formed by using methylene chloride and petroleum ether, then filtered to obtain compound C3 (1.35 g, 3.90 mmol).

14) Preparation of Compound C5

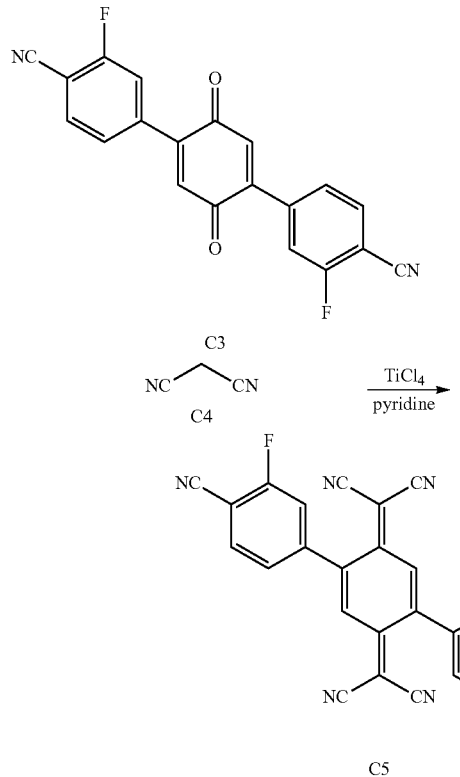

In a 500 ml round-bottom flask, compound C3 (1.35 g, 3.90 mmol) and compound C4 (2.58 g, 38.98 mmol) were added into methylene chloride (250 ml), and the mixture was cooled to 0° C. Then, titanium chloride (4.27 ml, 38.98 mmol) and pyridine (6.28 ml, 77.97 mmol) were slowly and sequentially added dropwise, then stirred at 60° C. for 24 hours. The reaction was terminated, then extracted with water and methylene chloride, concentrated, and then subjected to column separation using methylene chloride, ethyl acetate, and n-hexane. Then, a precipitation liquid was formed by using methylene chloride and petroleum ether, then filtered to obtain compound C5 (0.52 g, 1.18 mmol).

15) Preparation of Compound D3

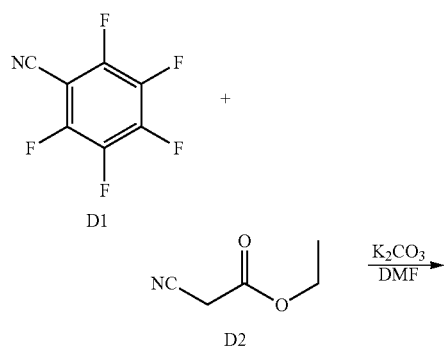

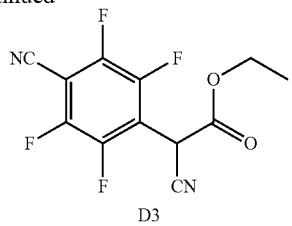

In a 250 ml round-bottom flask, compound D1 (10.00 g, 51.97 mmol), compound D2 (5.86 g, 51.79 mmol), and potassium carbonate (8.59 g, 62.15 mmol) were added into 100 ml of dimethylformamide, and the mixture was cooled at room temperature for 4 hours. After the reaction was terminated, water and acetic acid were added thereinto, then stirred for 30 minutes, extracted with chloroform, and then concentrated to obtain compound D3 (14.52 g, 97.96 mmol) as a yellow liquid.

16) Preparation of Compound D4

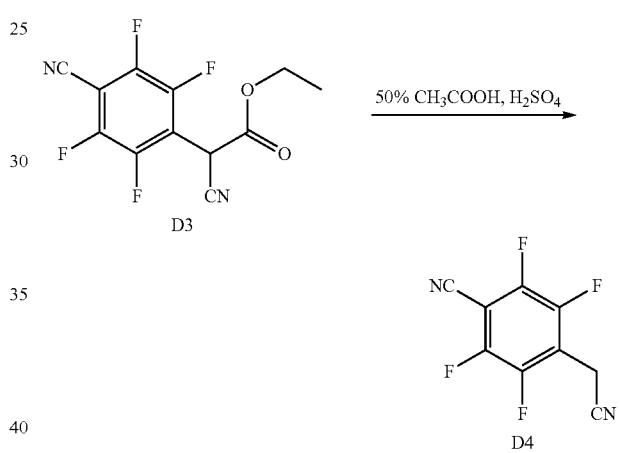

Compound D3 (14.52 g, 50.74 mmol) was added in a 100 ml round-bottom flask, and 50% acetic acid (20 ml), and sulfuric acid (1.00 ml) were added thereinto, then stirred at 100° C. for 24 hours. After the reaction was terminated, the reacted material was lowered to room temperature, then extracted with water and chloroform, and then the moisture was removed over magnesium sulfate. The resultant material was dried in a vacuum oven to obtain compound D4 (9.21 g, 43.03 mmol).

17) Preparation of Compound D5

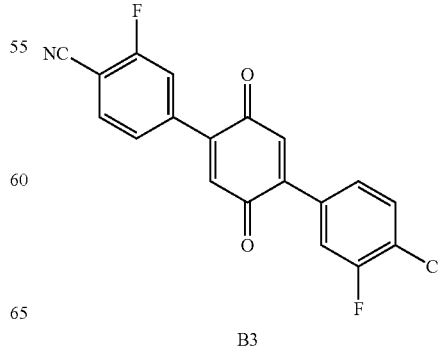

-continued

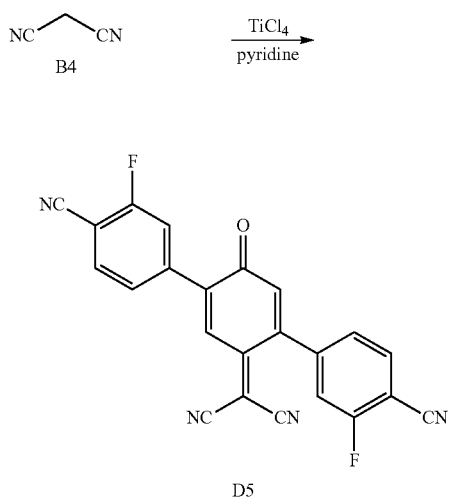

D5

In a 500 ml round-bottom flask, compound B3 (2.00 g, 5.78 mmol) and compound B4 (0.57 g, 8.66 mmol) were added into methylene chloride (250 ml), and the mixture was cooled to 0° C. Then, titanium chloride (0.95 ml, 8.66 mmol) and pyridine (1.40 ml, 17.33 mmol) were slowly and sequentially added dropwise, then stirred at room temperature for 24 hours. The reaction was terminated, then extracted with water and methylene chloride, concentrated, and then subjected to column separation using methylene chloride, ethyl acetate, and n-hexane. Then, a precipitation liquid was formed by using methylene chloride and petroleum ether, then filtered to obtain compound A3 (0.82 g, 2.08 mmol).

18) Preparation of Compound D6

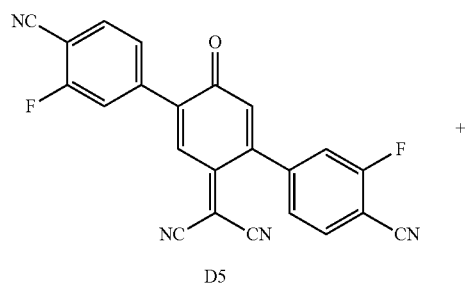

D5

+

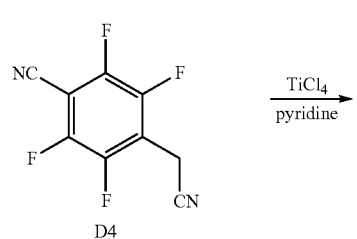

D4

-continued

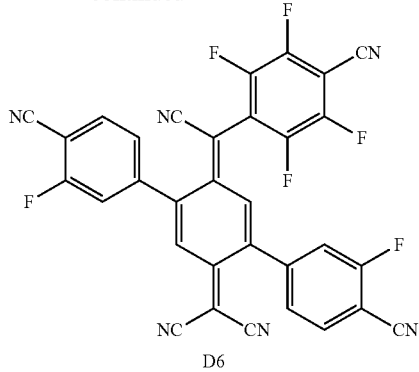

D6

In a 500 ml round-bottom flask, compound D5 (0.82 g, 2.08 mmol) and compound B4 (4.45 g, 20.79 mmol) were added into methylene chloride (200 ml), and the mixture was cooled to 0° C. Then, titanium chloride (2.28 ml, 20.79 mmol) and pyridine (3.35 ml, 41.59 mmol) were slowly and sequentially added dropwise, then stirred at 60° C. for 24 hours. The reaction was terminated, then extracted with water and methylene chloride, concentrated, and then subjected to column separation using methylene chloride, ethyl acetate, and n-hexane. Then, a precipitation liquid was formed by using methylene chloride and petroleum ether, then filtered to obtain compound D6 (0.48 g, 0.88 mmol).

Hereinafter, organic light emitting devices manufactured by doping charge transporting compounds A, B, A5, B5, C5, and D6 of the present invention, which were prepared in the foregoing synthetic examples, in hole injection layers, respectively.

Example 1

An ITO substrate was patterned to have a light emission area of 3 mm×3 mm, and then washed. The substrate was mounted on the vacuum chamber and the basic pressure was then set to 1×10$^{-6}$ torr. Thereafter, sequentially, a hole injection layer was formed on the ITO as an anode to form a thickness of 100 Å by the use of α-NPD. Compound A was doped at a doping concentration of 25%. A hole transport layer was formed that had a thickness of 600 Å by the use of α-NPD. A light emitting layer was formed that had a thickness of 250 Å by doping a host MADN with a dopant BD-1 at a doping concentration of 4%. An electron transport layer was formed that had a thickness of 300 Å by the use of Alq3. An electron injection layer was formed that had a thickness of 10 Å by the use of LiF. An anode was formed that had a thickness of 300 Å by the use of Alto thereby manufacture an organic light emitting device.

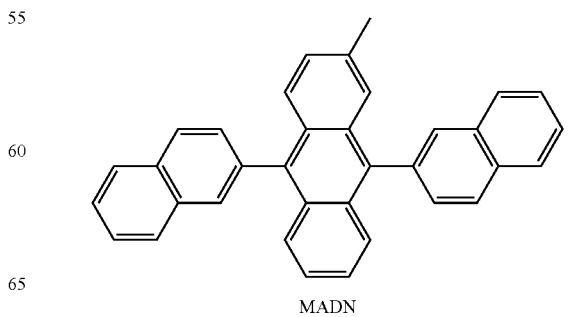

MADN

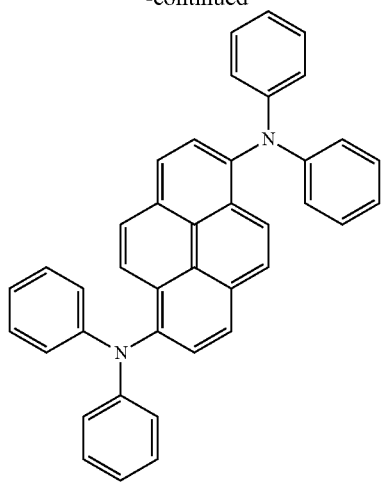

BD-1

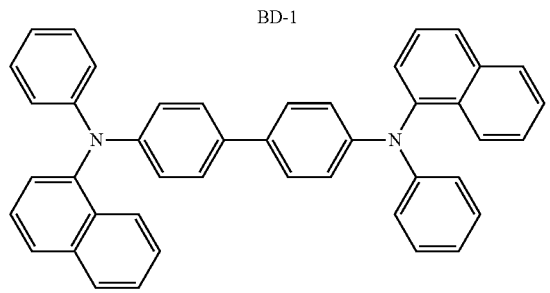

α-NPB

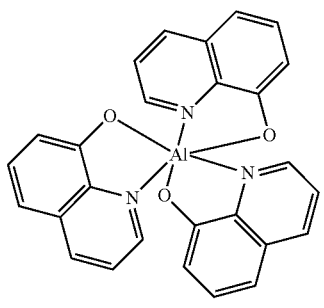

Alq₃

Example 2

An organic light emitting device was manufactured under the same process conditions as in example 1, except that compound B was doped in a hole injection layer.

Example 3

An organic light emitting device was manufactured under the same process conditions as in example 1, except that compound A5 was doped in a hole injection layer.

Example 4

An organic light emitting device was manufactured under the same process conditions as in example 1, except that compound B5 was doped in a hole injection layer.

Example 5

An organic light emitting device was manufactured under the same process conditions as in example 1, except that compound C5 was doped in a hole injection layer.

Example 6

An organic light emitting device was manufactured under the same process conditions as in example 1, except that compound D6 was doped in a hole injection layer.

Comparative Example 1

An organic light emitting device was manufactured under the same process conditions as in example 1, except that HAT-CN was doped in a hole injection layer.

Comparative Example 2

An organic light emitting device was manufactured under the same process conditions as in comparative example 1, except that a hole injection layer was formed of DNTPD without doping using any dopant.

Comparative Example 3

An organic light emitting device was manufactured under the same process conditions as in comparative example 2, except that a hole injection layer was not formed.

Figure 7:
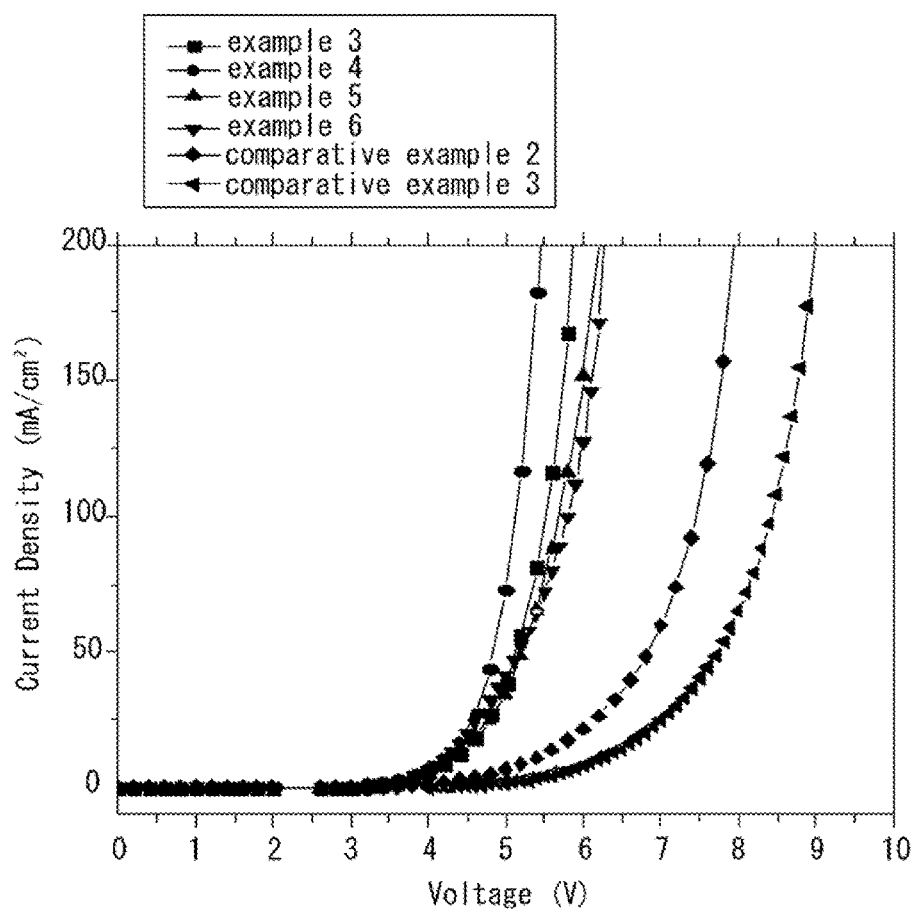
FIG. 7 is a graph showing voltage and current correlations of organic light emitting devices manufactured according to examples 1 and 2 and comparative example 1 of the present invention.

The driving voltage, quantum efficiency, current efficiency, power efficiency, luminance, and color coordinates of the organic light emitting devices manufactured according to examples 1 and 2 and comparative example 1 were measured, and are shown in table 1 below. In addition, the correlations between voltage and current of the organic light emitting devices, manufactured according to examples 1 and 2 and comparative example 1 of the present invention, are shown in FIG. 7. (Current corresponds to experimental results values using 10 mA/cm²)

TABLE 1

| # | driving voltage (V) | Emission efficiency | | | Luminance (Cd/m²) | color coordinates | |
|---|---|---|---|---|---|---|---|
| | | quantum efficiency (%) | current efficiency (Cd/A) | power efficiency (lm/W) | | CIE_x | CIE_y |
| Comparative Example | 5.6 | 5.49 | 4.58 | 2.33 | 458 | 0.138 | 0.095 |
| Example 1 | 4.8 | 6.21 | 5.42 | 3.53 | 542 | 0.138 | 0.099 |
| Example 2 | 4.5 | 6.62 | 5.59 | 3.89 | 559 | 0.138 | 0.097 |

Referring to Table 1 and FIG. 7, an equal level of color coordinates was exhibited between examples 1 and 2 of the present invention and comparative example. Also, the driving voltage was reduced by about 14 to 19% in examples 1 and 2 compared with comparative example 1. In addition, the quantum efficiency, current efficiency, power efficiency, and luminance were further improved in examples 1 and 2 compared with comparative example.

In addition, the driving voltages of the organic light emitting devices manufactured according to examples 3 to 6 and comparative examples 2 and 3 were measured, and are shown in table 2 below. In addition, the correlations between voltage and current of the organic light emitting devices manufactured according to examples 3 to 6 and comparative examples 2 and 3 of the present invention are shown in FIG. 8.

TABLE 2

|  | Driving voltage (V) |
| --- | --- |
| Example 3 | 4.63 |
| Example 4 | 4.51 |
| Example 5 | 4.81 |
| Example 6 | 4.83 |
| Comparative example 2 | 5.27 |
| Comparative example 3 | 6.1 |

Figure 8:
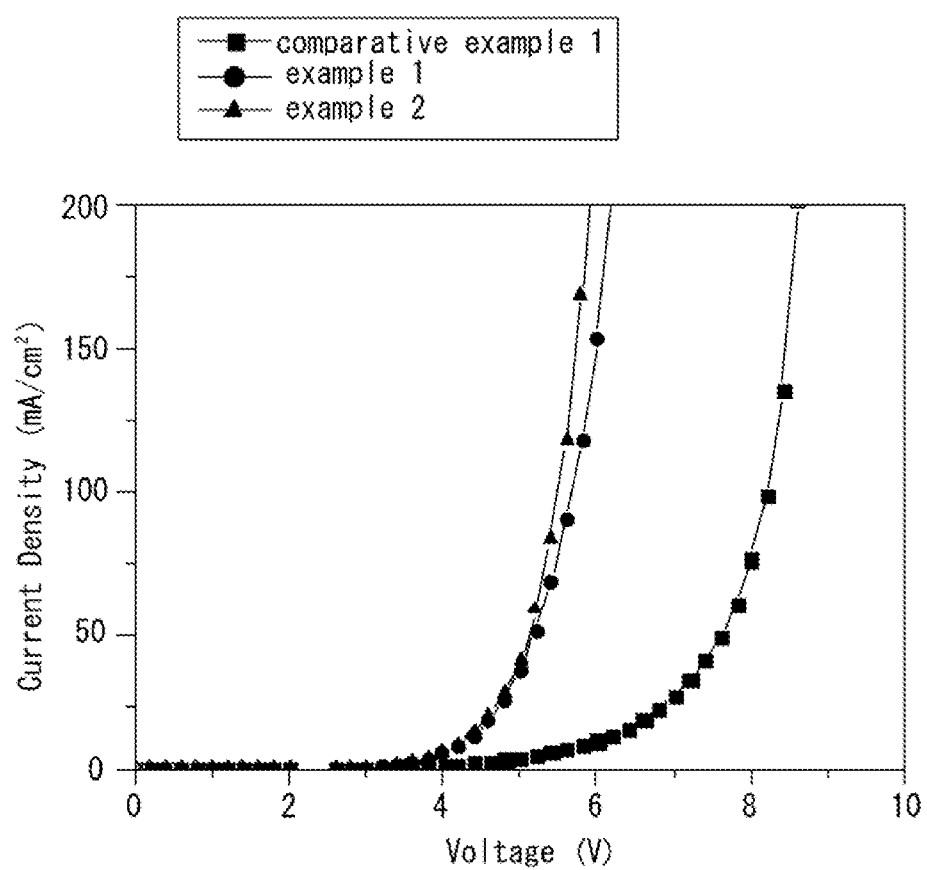
FIG. 8 is a graph showing voltage and current correlations of organic light emitting devices manufactured according to examples 3 to 6 and comparative example 2 and 3 of the present invention.

Referring to table 2 and FIG. 8, the driving voltage was reduced by about 8 to 14% in examples 3 to 6 compared with comparative example 2 and reduced by 21 to 26% compared with comparative example 3.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic compound of chemical formula 1:

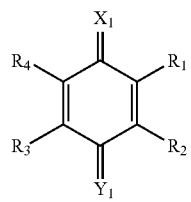

wherein $R_1$, $R_2$, $R_3$ and $R_4$ each represent, independently of each other, a hydrogen atom, a deuterium atom, —OH, —CN, —NO$_2$, —CF$_3$, a fluoroalkyl group, a halogen group, a carboxyl group, a carbonyl group, a C1-C18 substituted or unsubstituted alkoxy group, a C6 or more substituted or unsubstituted aromatic group, a C5 or more substituted or unsubstituted heteroaromatic group, a C6 or more substituted or unsubstituted aryloxy group, C5 or more substituted or unsubstituted heteroaryloxy group, a C1-C18 amine group, an amine group containing a C6 or more substituted or unsubstituted aromatic group, or an amine group containing a C5 or more substituted or unsubstituted heteroaromatic group;

at least one of $R_1$, $R_2$, $R_3$ and $R_4$ represent a C6 or more substituted or unsubstituted aromatic group, a C5 or more substituted or unsubstituted heteroaromatic group, a C1-C18 amine group, an amine group containing a C6 or more substituted or unsubstituted aromatic group, an amine group containing a C5 or more substituted or unsubstituted heteroaromatic group;

$X_1$ and $Y_1$ each represent, independently from each other, (a), (b), or (d):

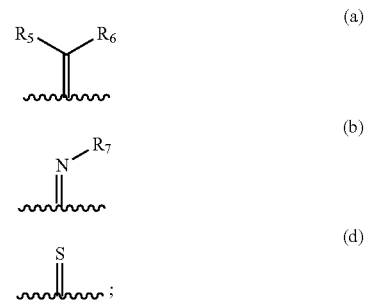

and $R_5$, $R_6$ and $R_7$ each represent, independently from each other, a hydrogen atom, a deuterium atom, —OH, —CN, —NO$_2$, —CF$_3$, a fluoroalkyl group, a halogen group, a carboxyl group, a carbonyl group, a C1-C18 substituted or unsubstituted alkyl group, a C1-C18 substituted or unsubstituted alkoxy group, a C6 or more substituted or unsubstituted aromatic group, a C6 or more substituted or unsubstituted aryloxy group, a C5 or more substituted or unsubstituted heteroaromatic group, or a C5 or more substituted or unsubstituted heteroaryloxy group, wherein $X_1$ and $Y_1$ are different each other, and wherein $R_5$ and $R_6$ are optionally linked to each other to form a ring.

2. The organic compound of claim 1, wherein the compound of chemical formula 1 is selected from:

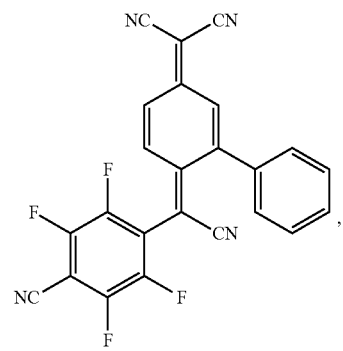

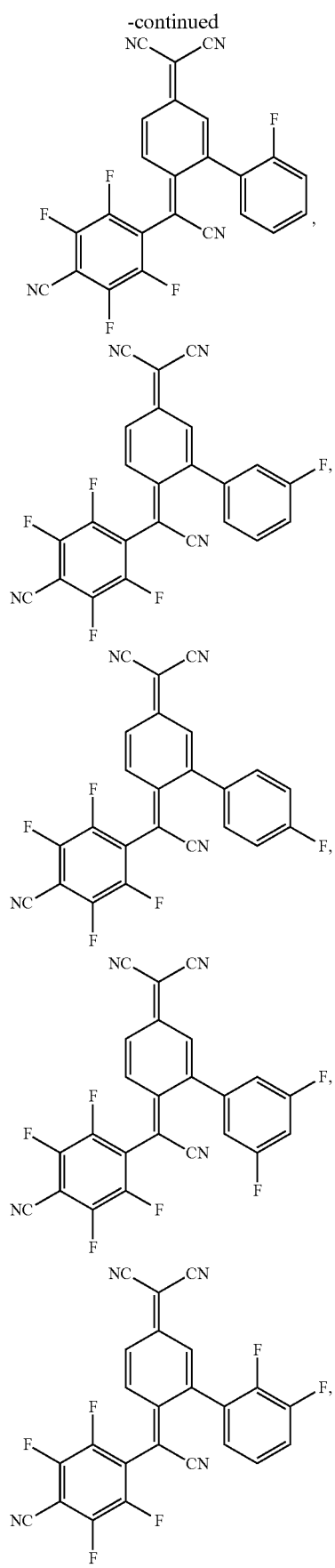
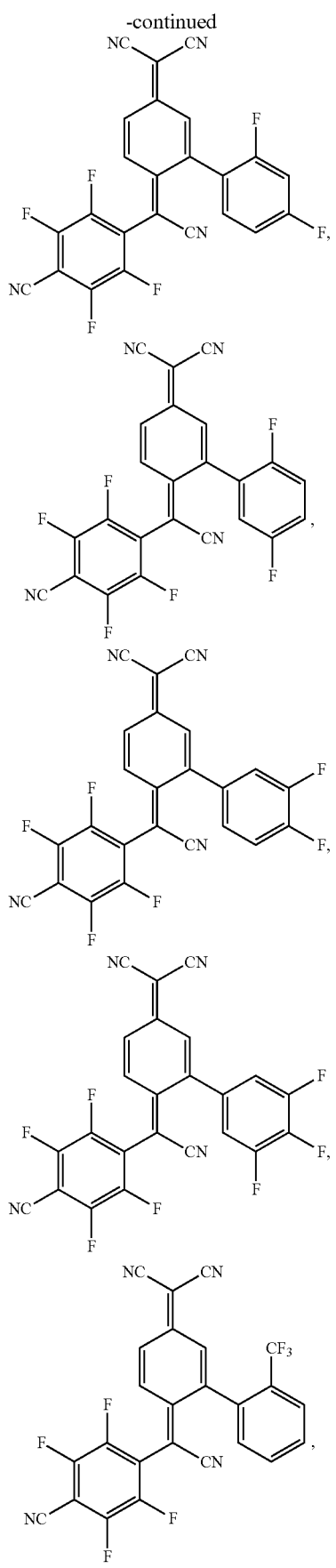

-continued
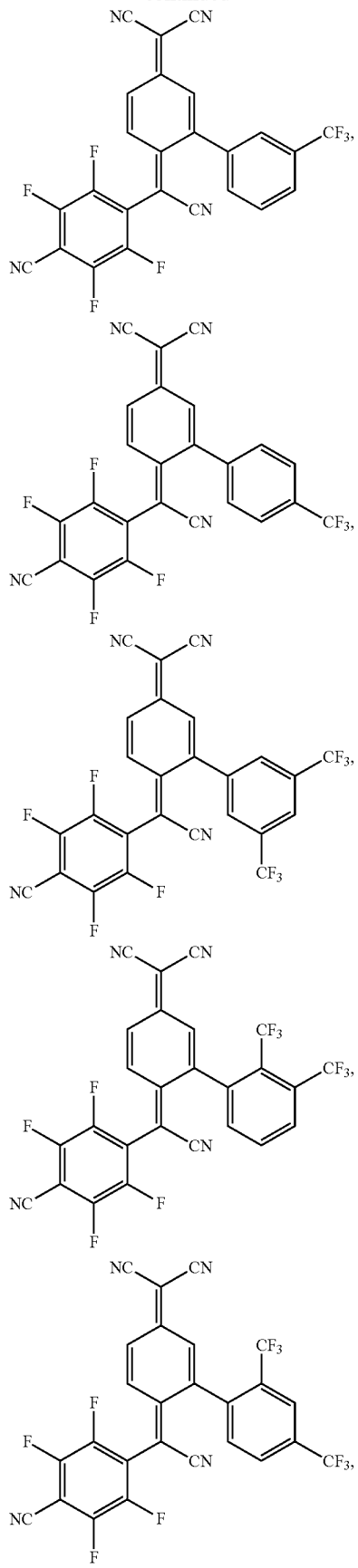
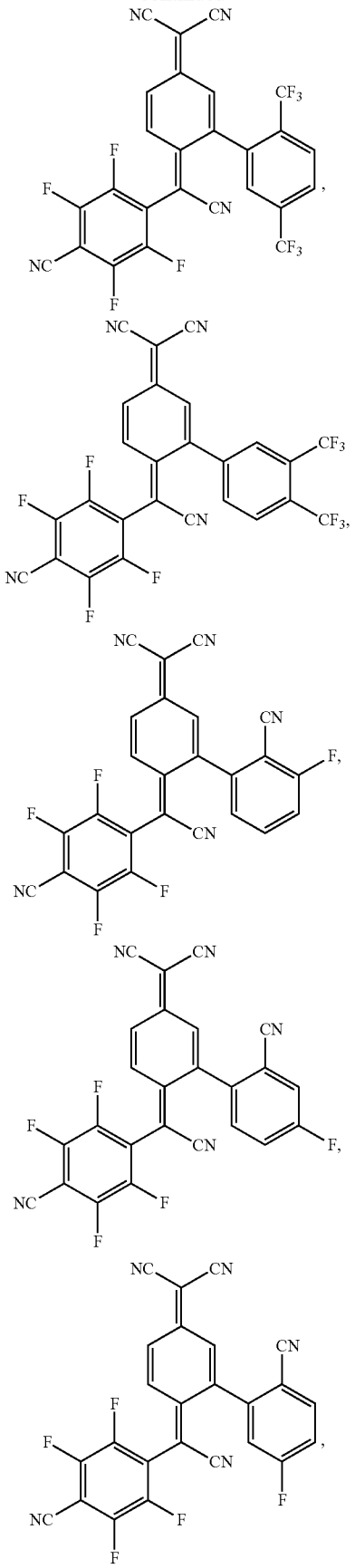

-continued
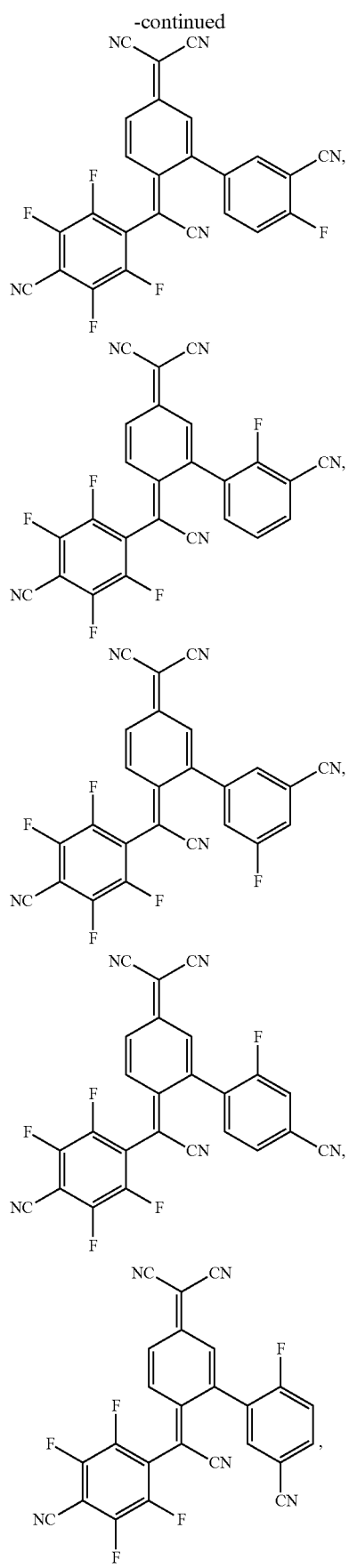
-continued
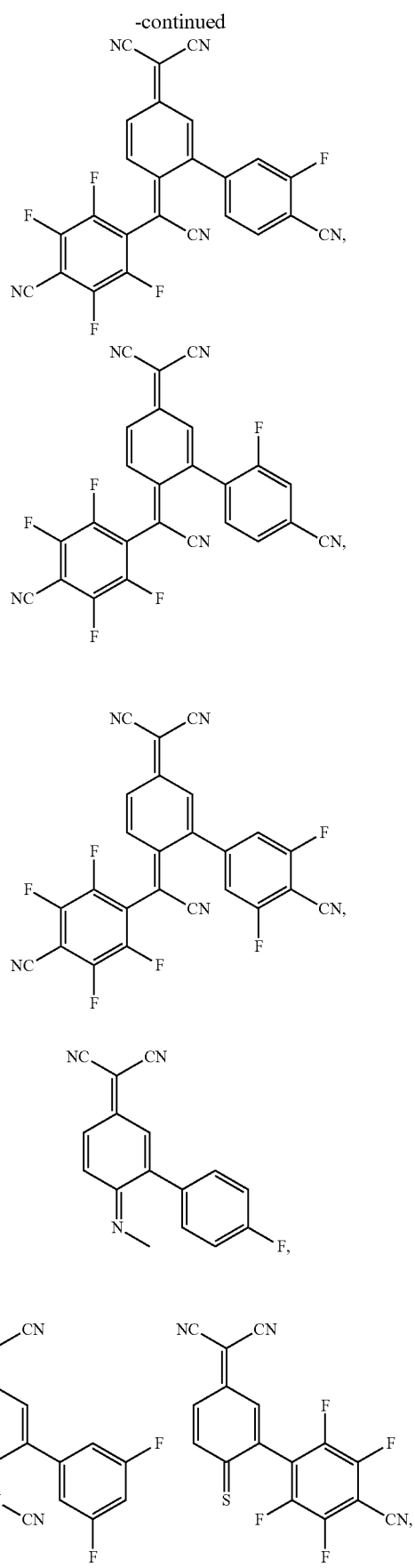

59
-continued
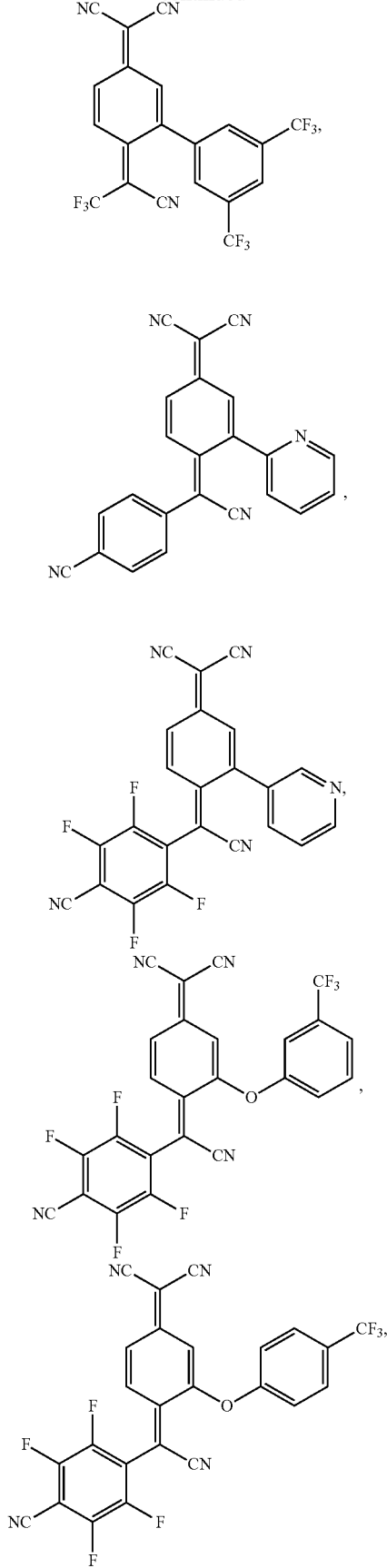
60
-continued
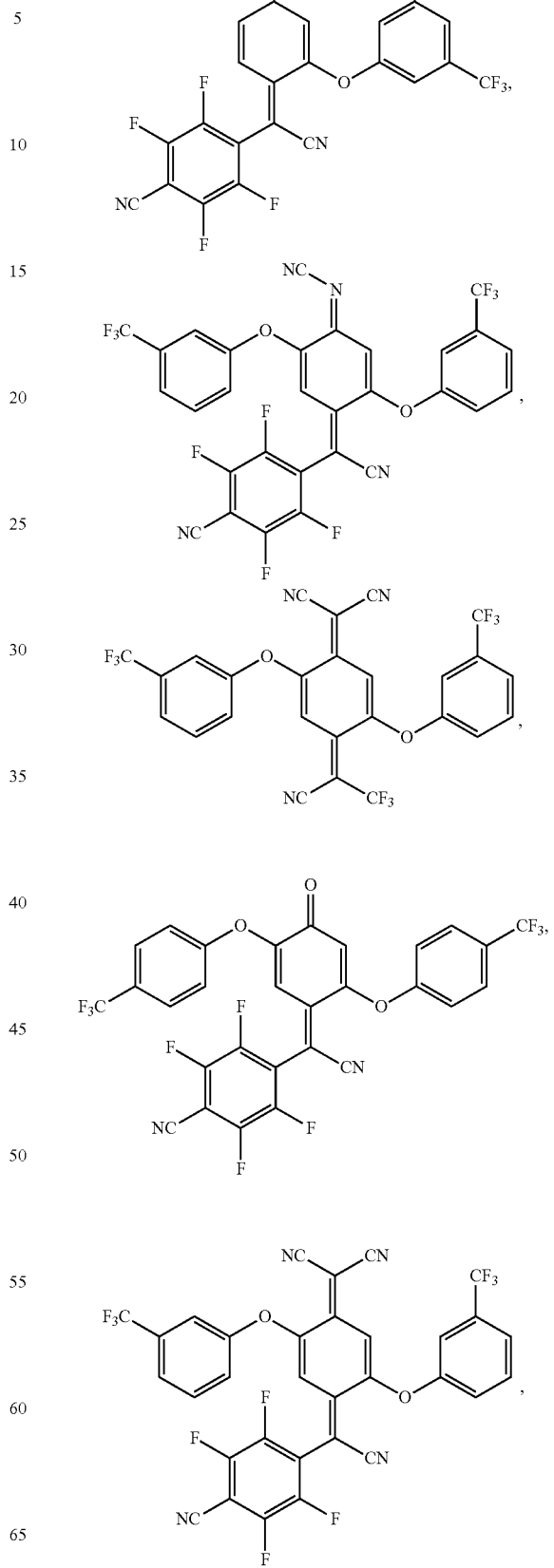

-continued

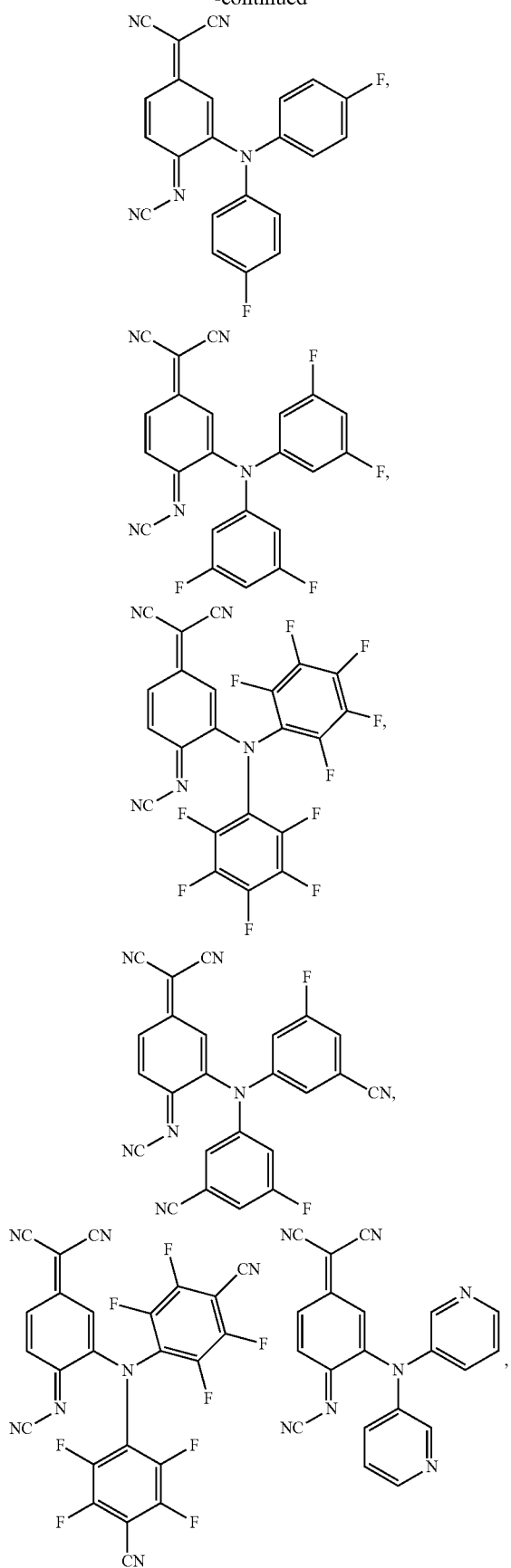

-continued

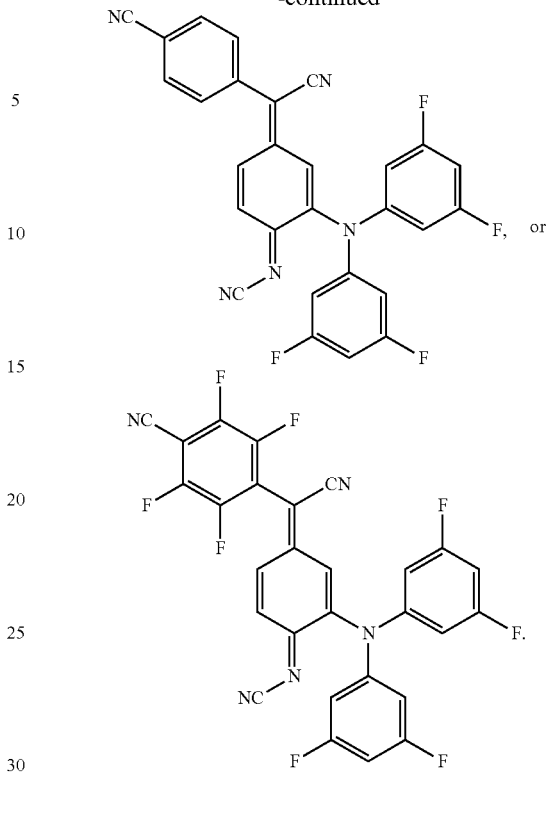

3. An organic compound of chemical formula 2:

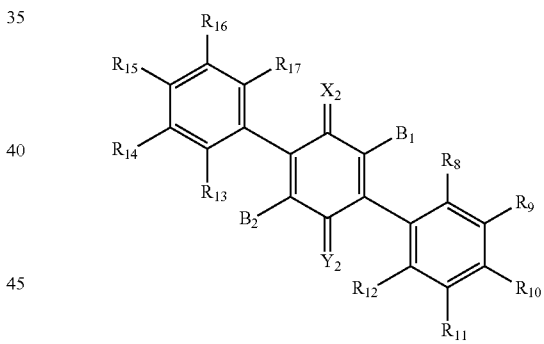

wherein $B_1$ and $B_2$ each represent, independently from each other, a hydrogen atom, a deuterium atom, —CN, —NO$_2$, —CF$_3$, —F, a fluoroalkyl group, or a halogen group;

$R_8$ to $R_{17}$ each represent, independently from each other, a hydrogen atom, a deuterium atom, —OH, —CN, —NO$_2$, —CF$_3$, a fluoroalkyl group, halogen group, a carboxyl group, a carbonyl group, a C1-C18 substituted or unsubstituted alkyl group, a C1-C18 substituted or unsubstituted alkoxy group, a C6 or more substituted or unsubstituted aromatic group, a C5 or more substituted or unsubstituted heteroaromatic group, a C6 or more substituted or unsubstituted aryloxy group, C5 or more substituted or unsubstituted heteroaryloxy group, a C1-C18 amine group, an amine group containing a C6 or more substituted or unsubstituted aromatic group, an amine group containing a C5 or more substituted or unsubstituted heteroaromatic group, a silyl group containing a C1-C27 alkyl group or a C6 or more substituted or unsubstituted aromatic group, or a silyl group containing a C5 or more substituted or unsubstituted heteroaromatic group, and at least one of $R_8$ to $R_{17}$ represents —CN, —NO$_2$, —CF$_3$, —F, or a fluoroalkyl group;

$X_2$ and $Y_2$ each represent, independently from each other, (f), or (h):

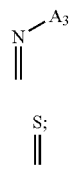

and $A_3$ represents a hydrogen atom, a deuterium atom, —OH, —CN, —NO$_2$, —CF$_3$, a fluoroalkyl group, a halogen group, a carboxyl group, a carbonyl group, a C1-C18 substituted or unsubstituted alkyl group, a C1-C18 substituted or unsubstituted alkoxy group, a C6 or more substituted or unsubstituted aromatic group, a C6 or more substituted or unsubstituted aryloxy group, a C5 or more substituted or unsubstituted heteroaromatic group, or a C5 or more substituted or unsubstituted heteroaryloxy group.

4. The organic compound of claim 3, wherein the organic compound of chemical formula 2 is selected from:

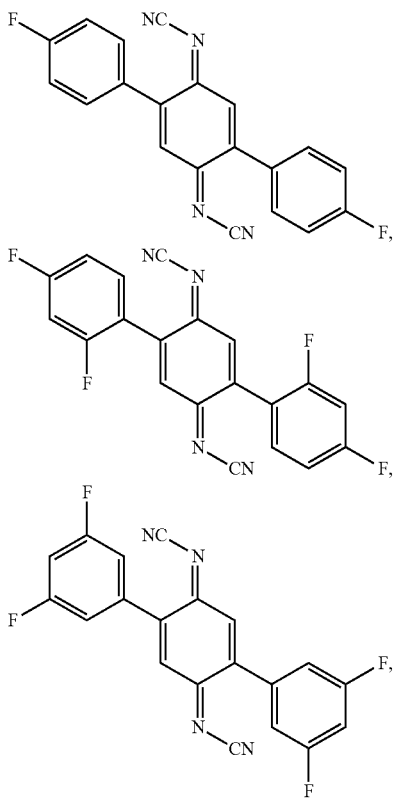

-continued

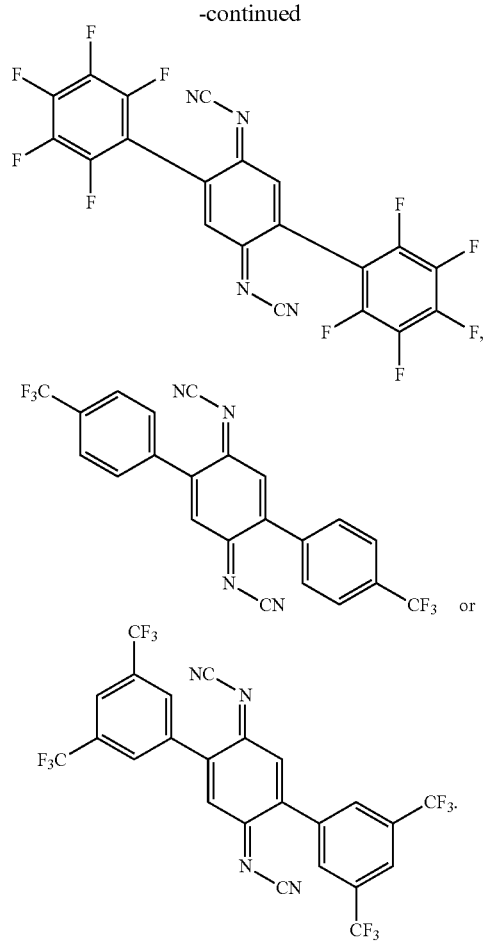

5. An organic light emitting device comprising a light emitting layer between an anode and a cathode, and at least one organic film between the anode and the light emitting layer,
wherein the organic film contains the organic compound of claim 1.

6. The organic light emitting device of claim 5, wherein the organic film is at least one selected from a hole injection layer, a hole transport layer, and a hole buffer layer.

7. The organic light emitting device of claim 6, wherein the hole injection layer is formed of only the organic compound.

8. The organic light emitting device of claim 6, wherein the hole buffer layer is disposed between the hole injection layer and the hole transport layer, and contacted with the anode.

9. The organic light emitting device of claim 6, wherein the hole buffer layer is disposed between the hole injection layer and the hole transport layer.

10. The organic light emitting device of claim 8, wherein the hole buffer layer is formed of only the organic compound, or formed of a host material and the organic compound.

11. The organic light emitting device of claim 10, wherein the host material is a material of the hole transport layer.

12. The organic light emitting device of claim 6, wherein the hole transport layer is disposed on the hole injection layer, and formed of a material of the hole transport layer and the organic compound.

13. An organic light emitting device comprising a plurality of stacks between an anode and a cathode, each of the stacks including a light emitting layer, the plurality of stacks including a first stack and a second stack,
wherein the first stack including a first light emitting layer, the second stack includes a second light emitting layer, and a charge generation layer is disposed between the first stack and the second stack,
wherein the charge generation layer includes an N-type charge generation layer and a P-type charge generation layer, and
wherein the P-type charge generation layer contains the organic compound of claim 1.

14. The organic light emitting device of claim 13, wherein the first stack includes at least one organic film disposed between the anode and the first light emitting layer, the organic film being at least one of a hole injection layer, a first hole transport layer, and a hole buffer layer.

15. The organic light emitting device of claim 13, wherein the first stack includes a first hole transport layer, the P-type charge generation layer is formed of only the organic compound or formed of a host material or the organic compound.

16. The organic light emitting device of claim 15, wherein the host material is a material of the hole transport layer.

17. The organic light emitting device of claim 15, wherein the second stack includes a second hole transport layer disposed between the P-type charge generation layer and the second light emitting layer.

18. The organic light emitting device of claim 15, wherein the P-type charge generation layer is contacted with the second light emitting layer.

19. The organic light emitting device of claim 14, wherein the hole injection layer is formed of only the organic compound.

20. The organic light emitting device of claim 14, wherein the hole buffer layer is disposed between the anode and the first hole transport layer, and contacted with the anode.

21. The organic light emitting device of claim 14, wherein the hole buffer layer is disposed between the hole injection layer and the first hole transport layer.

22. The organic light emitting device of claim 20, wherein the hole buffer layer is formed of only the organic compound, or formed of a host material and the organic compound.

23. The organic light emitting device of claim 22, wherein the host material is a material of the first hole transport layer.

24. The organic light emitting device of claim 14, wherein the first hole transport layer is disposed on the hole injection layer, and formed of a material of the first hole transport layer and the organic compound.

25. The organic compound of claim 1, wherein the organic compound is contained in at least one organic film of an organic light emitting device.

26. The organic compound of claim 1, wherein the organic compound has electron accepting capacity.

27. The organic compound of claim 25, wherein the organic film is at least one selected from a hole injection layer, a hole transport layer, and a hole buffer layer.

28. The organic compound of claim 27, wherein the hole injection layer is formed of only the organic compound.

29. The organic compound of claim 27, wherein the hole buffer layer is disposed between the hole injection layer and the hole transport layer, and contacted with the anode, the hole buffer layer is disposed between the hole injection layer and the hole transport layer, and the hole buffer layer is formed of only the organic compound, or formed of a host material and the organic compound.

30. The organic compound of claim 27, wherein the hole transport layer is disposed on the hole injection layer, and formed of a material of the hole transport layer and the organic compound.

31. The organic compound of claim 1, wherein the compound is contained in an organic light emitting device,
wherein the organic light emitting device comprises comprising a plurality of stacks between an anode and a cathode, each of the stacks including a light emitting layer, the plurality of stacks including a first stack and a second stack,
wherein the first stack includes a first light emitting layer, the second stack includes a second light emitting layer, and a charge generation layer is disposed between the first stack and the second stack,
wherein the charge generation layer includes an N-type charge generation layer and a P-type charge generation layer, and
wherein the compound is contained in the P-type charge generation layer.

32. The organic compound of claim 31, wherein the first stack includes at least one organic film disposed between the anode and the first light emitting layer, the organic film being at least one of a hole injection layer, a first hole transport layer, and a hole buffer layer.

33. The organic compound of claim 31, wherein the first stack includes a first hole transport layer, the P-type charge generation layer is formed of only the organic compound or formed of a host material or the organic compound, wherein the host material is a material of the hole transport layer.

34. The organic compound of claim 31, wherein the second stack includes a second hole transport layer disposed between the P-type charge generation layer and the second light emitting layer, and the P-type charge generation layer is contacted with the second light emitting layer.

35. The organic compound of claim 32, wherein the hole injection layer is formed of only the organic compound.

36. The organic compound of claim 32, wherein the hole buffer layer is disposed between the anode and the first hole transport layer, and contacted with the anode, the hole buffer layer is disposed between the hole injection layer and the first hole transport layer, and the hole buffer layer is formed of only the organic compound, or formed of a host material and the organic compound.

37. The organic compound of claim 32, wherein the first hole transport layer is disposed on the hole injection layer, and formed of a material of the first hole transport layer and the organic compound.

38. An organic compound which is a benzoquinone derivative comprising a substituent having an electron accepting capacity, wherein the organic compound is capable of increasing power efficiency, improving power consumption, and lowering the driving voltage, wherein the organic compound is selected from:
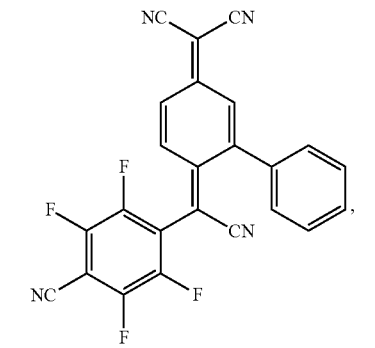,
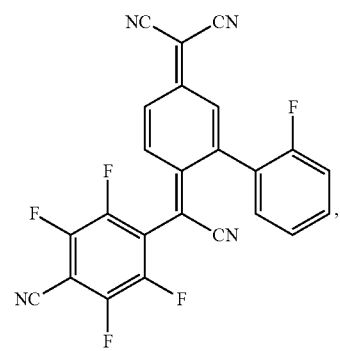,
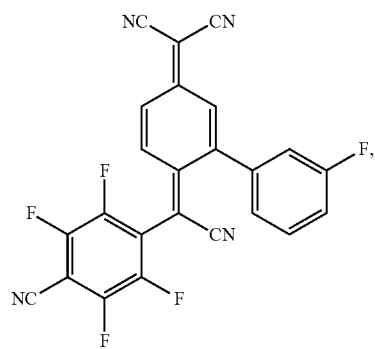,
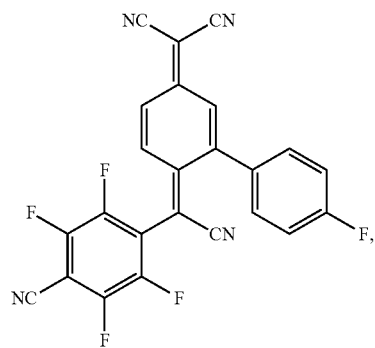,
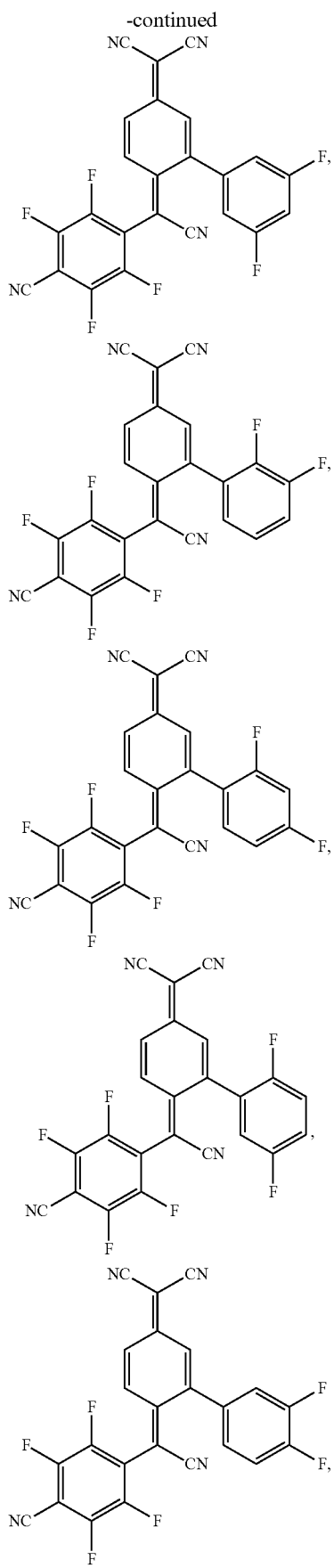

-continued
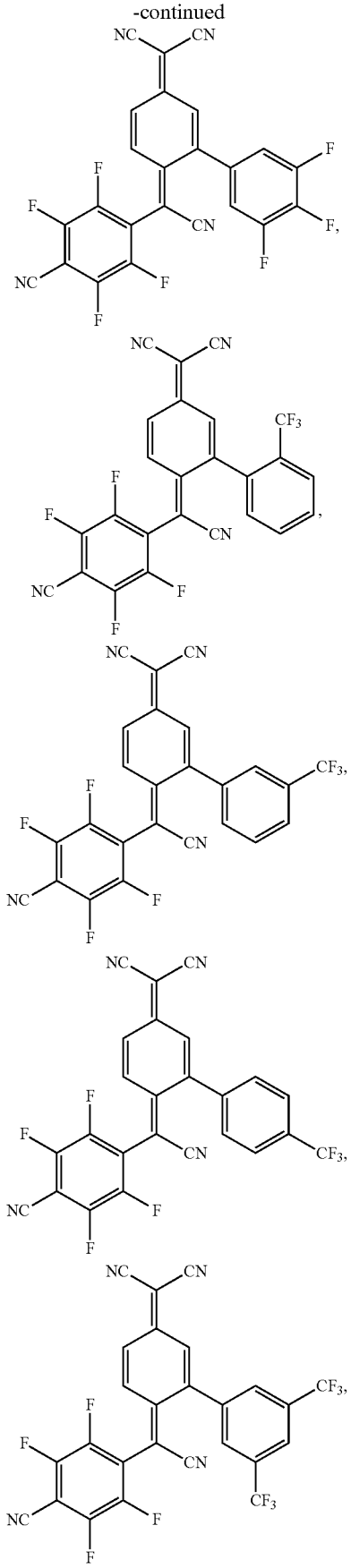
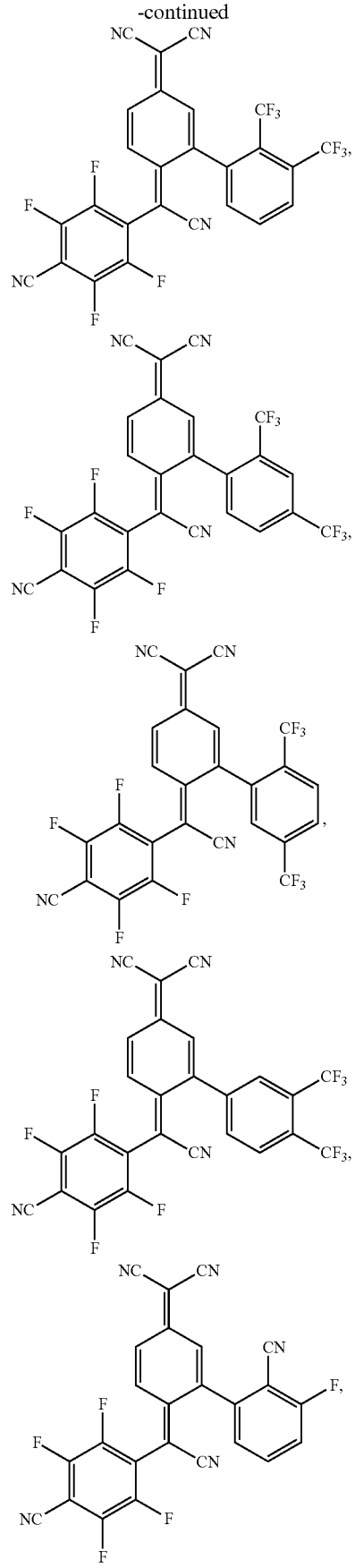

-continued
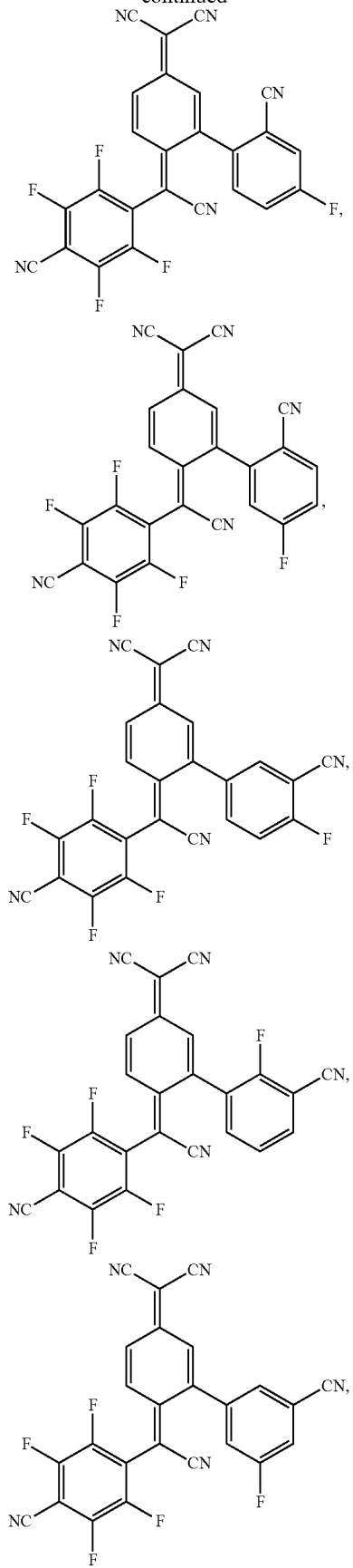
-continued
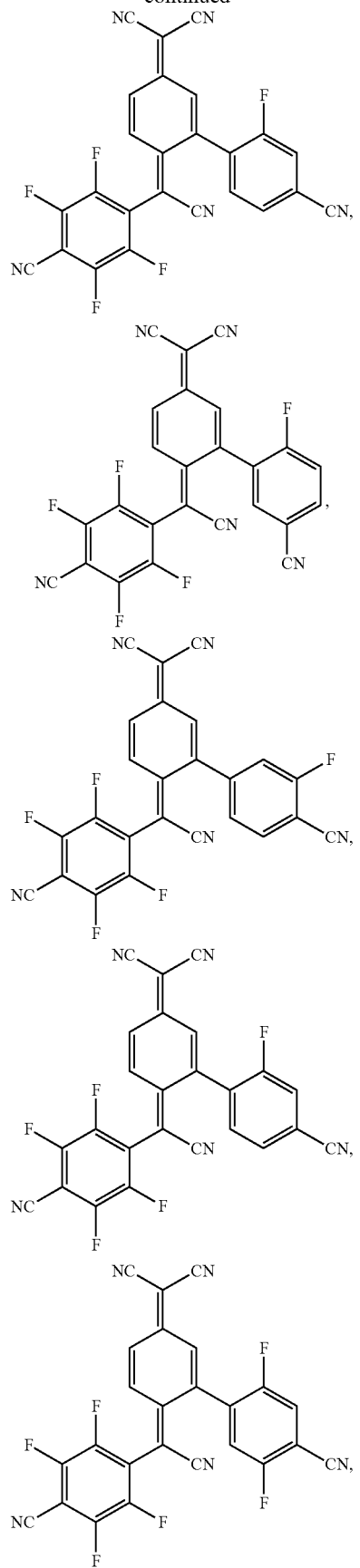

-continued
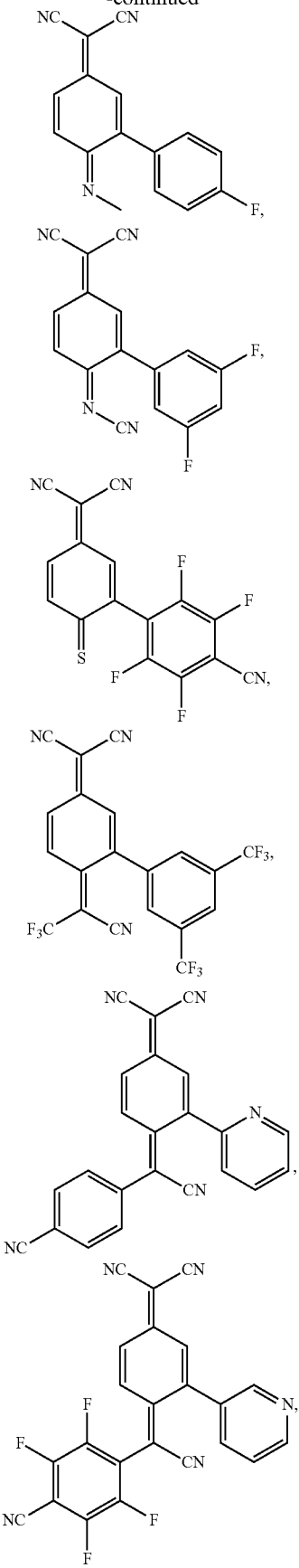
-continued
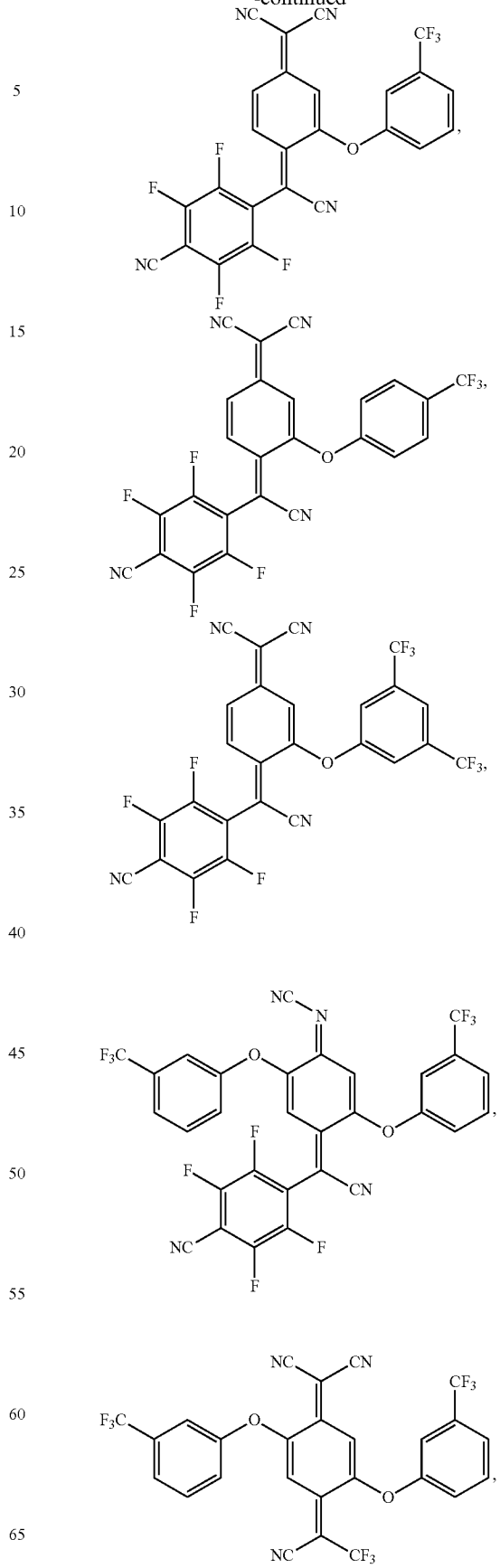

-continued
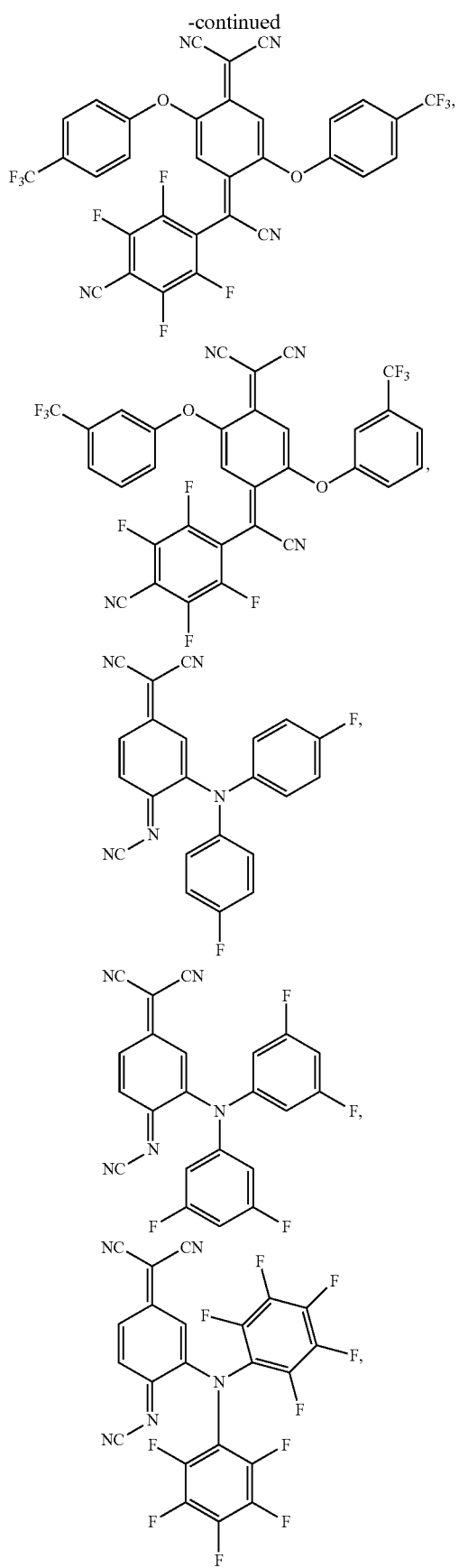
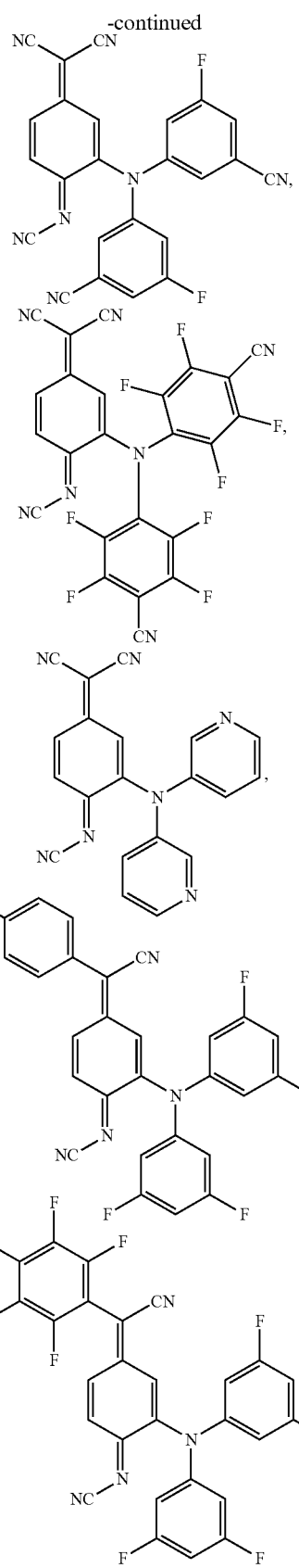
* * * * *